United States Patent
Wang et al.

(10) Patent No.: US 9,252,333 B2
(45) Date of Patent: *Feb. 2, 2016

(54) SEMICONDUCTOR LIGHT EMITTING ELEMENT AND LIGHT EMITTING DEVICE

(71) Applicant: TOYODA GOSEI CO., LTD., Kiyosu-shi, Aichi-ken (JP)

(72) Inventors: Honglin Wang, Ichihara (JP); Hironao Shinohara, Ichihara (JP); Eisuke Yokoyama, Ichihara (JP)

(73) Assignee: TOYODA GOSEI CO., LTD., Aichi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/062,523

(22) Filed: Oct. 24, 2013

(65) Prior Publication Data

US 2014/0117402 A1    May 1, 2014

(30) Foreign Application Priority Data

Oct. 25, 2012  (JP) ................. 2012-235584

(51) Int. Cl.
*H01L 33/00*  (2010.01)
*H01L 27/15*  (2006.01)
(Continued)

(52) U.S. Cl.
CPC ............ *H01L 33/382* (2013.01); *H01L 33/00* (2013.01); *H01L 33/20* (2013.01); *H01L 33/36* (2013.01); *H01L 33/38* (2013.01); *H01L 33/385* (2013.01); *H01L 33/44* (2013.01)

(58) Field of Classification Search
CPC ....... H01L 33/00; H01L 33/002; H01L 33/04; H01L 33/06; H01L 33/08; H01L 33/20; H01L 33/32; H01L 33/36; H01L 33/38; H01L 33/40; H01L 33/42; H01L 33/44; H01L 33/46; H01L 33/50; H01L 33/60; H01L 33/62; H01L 33/382; H01L 33/385; H01L 33/387; H01L 21/02; H01L 25/167; H01L 25/0753; H01L 27/153; H01L 27/156; H01L 21/02129; H01L 21/02164; H01L 21/0217; H01L 29/2364; H01L 29/2368; H01L 33/405; H01L 33/507; H01L 29/42364; H01L 29/42368
USPC ................ 257/79, 81, 99, 431, 432, 433, 459
See application file for complete search history.

(56) References Cited

U.S. PATENT DOCUMENTS

2005/0211989 A1* 9/2005 Horio et al. ................. 257/79
2006/0081868 A1    4/2006 Kotani
(Continued)

FOREIGN PATENT DOCUMENTS

| CN | 101438423 A | 5/2009 |
| CN | 101794804 A | 8/2010 |

(Continued)

*Primary Examiner* — Teresa M Arroyo
(74) *Attorney, Agent, or Firm* — Sughrue Mion, PLLC

(57) ABSTRACT

A semiconductor light emitting element (1) includes; an n-type semiconductor layer (120), a light emitting layer (130), a p-type semiconductor layer (140), a p-side power supply portion (150), and an n-side power supply portion (160) that includes an n-side power supply electrode (162), an n-side auxiliary electrode (163) and n-side connective electrodes (164). The n-side power supply electrode (162) and auxiliary electrode (163) are provided in the inner side beyond the p-type semiconductor layer (140) viewed from the light emitting layer (130). On the p-type semiconductor layer (140), a power supply insulating layer (170) transparent to light from the light emitting layer (130) is provided, and portions at lower side of the n-side power supply electrode (162) and auxiliary electrode (163) are set to have a thickness with which the light is easily reflected, and other portions are set to have a thickness with which the light is easily transmitted.

9 Claims, 16 Drawing Sheets

(51) Int. Cl.
  *H01L 29/26* (2006.01)
  *H01L 31/12* (2006.01)
  *H01L 29/267* (2006.01)
  *H01L 27/14* (2006.01)
  *H01L 31/0232* (2014.01)
  *H01L 31/0203* (2014.01)
  *H01L 31/00* (2006.01)
  *H01L 33/38* (2010.01)
  *H01L 33/20* (2010.01)
  *H01L 33/36* (2010.01)
  *H01L 33/44* (2010.01)

(56) References Cited

U.S. PATENT DOCUMENTS

| | | |
|---|---|---|
| 2007/0145380 A1 | 6/2007 | Shum et al. |
| 2007/0176188 A1* | 8/2007 | Tanaka et al. .................... 257/88 |
| 2007/0228393 A1* | 10/2007 | Yoneda ............................ 257/79 |
| 2008/0185606 A1 | 8/2008 | Sano et al. |
| 2009/0101886 A1* | 4/2009 | Chang ............................. 257/13 |
| 2009/0159902 A1* | 6/2009 | Yasuda et al. .................... 257/88 |
| 2009/0251373 A1 | 10/2009 | Shum et al. |
| 2010/0133575 A1 | 6/2010 | Shum et al. |
| 2011/0006332 A1 | 1/2011 | Shum et al. |
| 2011/0008918 A1 | 1/2011 | Shum et al. |
| 2011/0024782 A1 | 2/2011 | Shum et al. |
| 2011/0140159 A1* | 6/2011 | Aoyagi ............................ 257/99 |
| 2011/0233596 A1 | 9/2011 | Sano et al. |
| 2012/0007109 A1 | 1/2012 | Seo et al. |
| 2012/0018766 A1* | 1/2012 | Emura ............................ 257/99 |
| 2012/0049219 A1 | 3/2012 | Kamiya et al. |
| 2012/0085988 A1* | 4/2012 | Yu et al. ......................... 257/13 |
| 2012/0119249 A1* | 5/2012 | Kim et al. ....................... 257/99 |
| 2012/0199861 A1* | 8/2012 | Tsuji .............................. 257/98 |
| 2012/0235195 A1 | 9/2012 | Shum et al. |
| 2012/0299465 A1* | 11/2012 | Toyota et al. ................... 313/498 |
| 2013/0069095 A1* | 3/2013 | Hodota ........................... 257/98 |
| 2013/0161585 A1 | 6/2013 | Na et al. |
| 2013/0168637 A1* | 7/2013 | Teranishi et al. ............... 257/13 |
| 2013/0207153 A1* | 8/2013 | Kamiya et al. ................. 257/99 |
| 2013/0234192 A1 | 9/2013 | Kim et al. |
| 2013/0270573 A1 | 10/2013 | Shum et al. |
| 2013/0277696 A1 | 10/2013 | Matsui et al. |
| 2014/0231842 A1 | 8/2014 | Akimoto et al. |
| 2014/0346554 A1 | 11/2014 | Shum et al. |
| 2015/0228860 A1 | 8/2015 | Shum et al. |
| 2015/0236210 A1 | 8/2015 | Kim et al. |

FOREIGN PATENT DOCUMENTS

| | | |
|---|---|---|
| JP | 2004-311677 A | 11/2004 |
| JP | 2007-287849 A | 11/2007 |
| JP | 2008-192710 A | 8/2008 |
| JP | 2009-537982 A | 10/2009 |
| JP | 2010-171167 A | 8/2010 |
| JP | 2012-028495 A | 2/2012 |
| JP | 2012-114343 A | 6/2012 |
| JP | 2012-138499 A | 7/2012 |
| JP | 2013-135234 A | 7/2013 |
| JP | 2014-131074 A | 7/2014 |
| WO | 2007/136392 A1 | 11/2007 |
| WO | 2012/067311 A1 | 5/2012 |

* cited by examiner

SEMICONDUCTOR LIGHT EMITTING ELEMENT AND LIGHT EMITTING DEVICE

CROSS REFERENCE TO RELATED APPLICATIONS

This application is based on and claims priority under 35 USC §119 from Japanese Patent Application No. 2012-235584 filed Oct. 25, 2012.

BACKGROUND

1. Technical Field

The present invention relates to a semiconductor light emitting element and a light emitting device.

2. Related Art

A semiconductor light emitting element using a light emitting layer such as GaInN, AlInGaP, and GaAlAs is used as a light emitting diode having high efficiency of emitting light. For example, a semiconductor light emitting element using a group III nitride semiconductor such as GaN is configured by forming a group III nitride semiconductor layer including a light emitting layer on a substrate of, for example, sapphire. There are such semiconductor light emitting elements that emit light emitted from the light emitting layer to the outside by mounting the semiconductor light emitting element on a wiring board by face up.

As a conventional technique described in a gazette, there is a semiconductor light emitting element configured by forming p-electrode on a p-type semiconductor layer opposite to the substrate with laminating the n-type semiconductor layer, light emitting layer and the p-type semiconductor layer on the substrate, and forming n-electrode on a n-type semiconductor layer exposed opposite to the substrate by removing a part of the both of the p-type semiconductor layer and the light emitting layer (Japanese Patent Application Laid-Open Publication No. 2012-028495).

However, in the case of adopting the configuration of the semiconductor layer exposed by removing the both of the p-type semiconductor layer and the light emitting layer in order to form the n-electrode, as much as the area of the light emitting layer of the semiconductor light emitting element is decreased, there has been a possibility to reduce the light emission from the semiconductor light emitting element.

Also, in the case of adopting the configuration of providing the n-electrode on a part opposite to the light emitting layer without removing any one of the p-type semiconductor layer and the light emitting layer, the light emitted from the light emitting layer is absorbed by the n-electrode, as a result, there has been a possibility to become hard to increase the light emission from the semiconductor light emitting element.

An object of the present invention is to increase the light emission from the semiconductor light emitting element to be used by face up mounting.

SUMMARY

According to an aspect of the present invention, there is provided a semiconductor light emitting element including: a first semiconductor layer that is composed of a compound semiconductor with a first conductive type; a light emitting layer that is provided on the first semiconductor layer to be contact with the first semiconductor layer, is composed of a compound semiconductor, and emits light with current flow; a second semiconductor layer that is provided on the light emitting layer to be contact with the light emitting layer and composed of a compound semiconductor with a second conductive type different from the first conductive type; a first power supply electrode that is provided at a rear side of the second semiconductor layer in the view from the light emitting layer, is composed of metal, and electrically connected to the first semiconductor layer; a second power supply electrode that is provided at the rear side of the second semiconductor layer in the view from the light emitting layer, is composed of metal, and electrically connected to the second semiconductor layer; and a transparent insulating layer that is provided at the rear side of the second semiconductor layer in the view from the light emitting layer, is composed of materials having permeability to the light of a wavelength emitted from the light emitting layer, and electrically insulates the first power supply electrode and the second power supply electrode; wherein the transparent insulating layer includes; a first transparent insulating portion that is set to have a first thickness with which the light emitted from the light emitting layer is easily transmitted, and is provided on portions at the rear side of the second semiconductor layer in the view from the light emitting layer where the first power supply electrode and the second power supply electrode are not provided; and a second transparent insulating portion that is set to have a second thickness with which the light emitted from the light emitting layer is easily reflected, and is provided on portions between the second semiconductor layer and the first power supply electrode and on portions between the second semiconductor layer and the second power supply electrode.

Such a semiconductor light emitting element further includes a first connective electrode that is electrically connected to the first semiconductor layer through a hole penetrating the transparent insulating layer, the second semiconductor layer and the light emitting layer; and a first auxiliary electrode that is provided at the rear side of the second semiconductor layer in the view from the light emitting layer and electrically connects the first connective electrode and the first power supply electrode.

Moreover, the first auxiliary electrode is composed of metals, and the second transparent insulating portion is provided between the second semiconductor layer and the first auxiliary electrode.

Further, the first connective electrode and the first auxiliary electrode are composed of transparent conductive materials having electronic conductivity and permeability to the light emitted from the light emitting layer.

Still further, the compound semiconductor is composed of a group III nitride semiconductor, and the first semiconductor layer is laminated on a substrate directly or through other layer.

According to another aspect of the present invention, there is provided a light emitting device including: a base portion in which a first wiring and a second wiring are formed; and a semiconductor light emitting element that is connected to the base portion by face up, wherein the semiconductor light emitting element includes; a first semiconductor layer that is composed of a compound semiconductor with a first conductive type; a light emitting layer that is provided on the first semiconductor layer to be contact with the first semiconductor layer, is composed of a compound semiconductor, and emits light with current flow; a second semiconductor layer that is provided on the light emitting layer to be contact with the light emitting layer and composed of a compound semiconductor with a second conductive type different from the first conductive type; a first power supply electrode that is provided at a rear side of the second semiconductor layer in the view from the light emitting layer, is composed of metal, electrically connected to the first semiconductor layer, and electrically connected to the first wiring provided on the base portion; a second power supply electrode that is provided at the rear side of the second semiconductor layer in the view from the light emitting layer, is composed of metal, electrically connected to the second semiconductor layer, and electrically connected to the second wiring provided on the base portion; and a transparent insulating layer that is provided at the rear side of the second semiconductor layer in the view from the light emitting layer, composed of materials having permeability to the light of a wavelength emitted from the light emitting layer, and electrically insulates the first power supply electrode and the second power supply electrode; wherein the transparent insulating layer includes; a first transparent insulating portion that is set to have a first thickness with which the light emitted from the light emitting layer is easily transmitted, and is provided on portions at the rear side of the second semiconductor layer in the view from the light emitting layer where the first power supply electrode and the second power supply electrode are not provided; and a second transparent insulating portion that is set to have a second thickness with which the light emitted from the light emitting layer is easily reflected, and is provided on portions between the second semiconductor layer and the first power supply electrode and on portions between the second semiconductor layer and the second power supply electrode.

According to the present invention, it is possible to increase the light emission from the semiconductor light emitting element to be used by face up mounting.

BRIEF DESCRIPTION OF THE DRAWINGS

An exemplary embodiment of the present invention will be described in detail based on the following figures, wherein.

DETAILED DESCRIPTION

Figure 1:
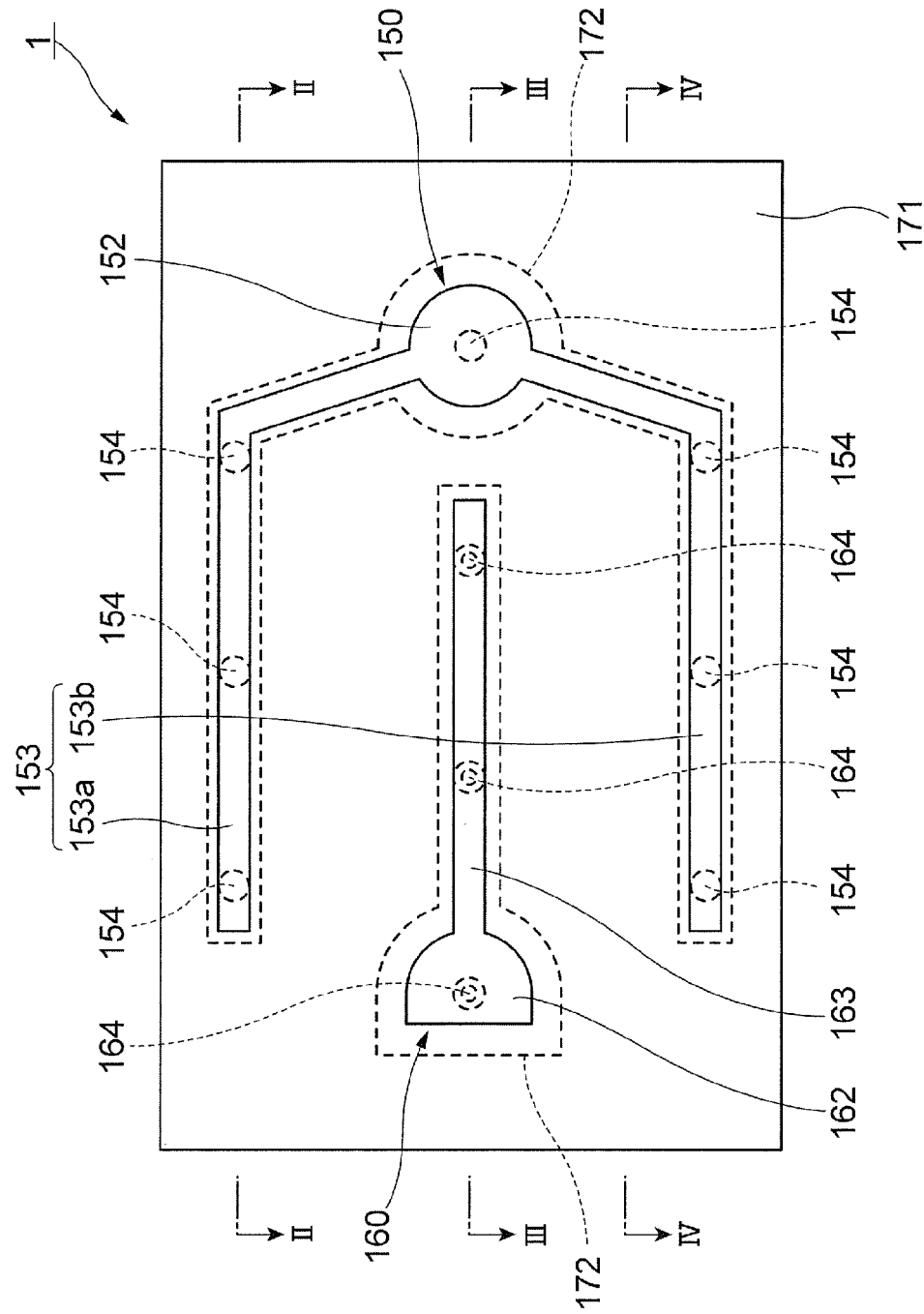
FIG. 1 is a diagram showing specific example of an upper surface of a semiconductor light emitting element according to the first exemplary embodiment.

Hereinafter, an exemplary embodiment according to the present invention will be described in detail with reference to the accompanying drawings. It should be noted that there are some cases where a size or a thickness of each component in the drawings that are referred to in the following description is different from a dimension of an actual semiconductor light emitting element and the like.

First Exemplary Embodiment

Figure 2:
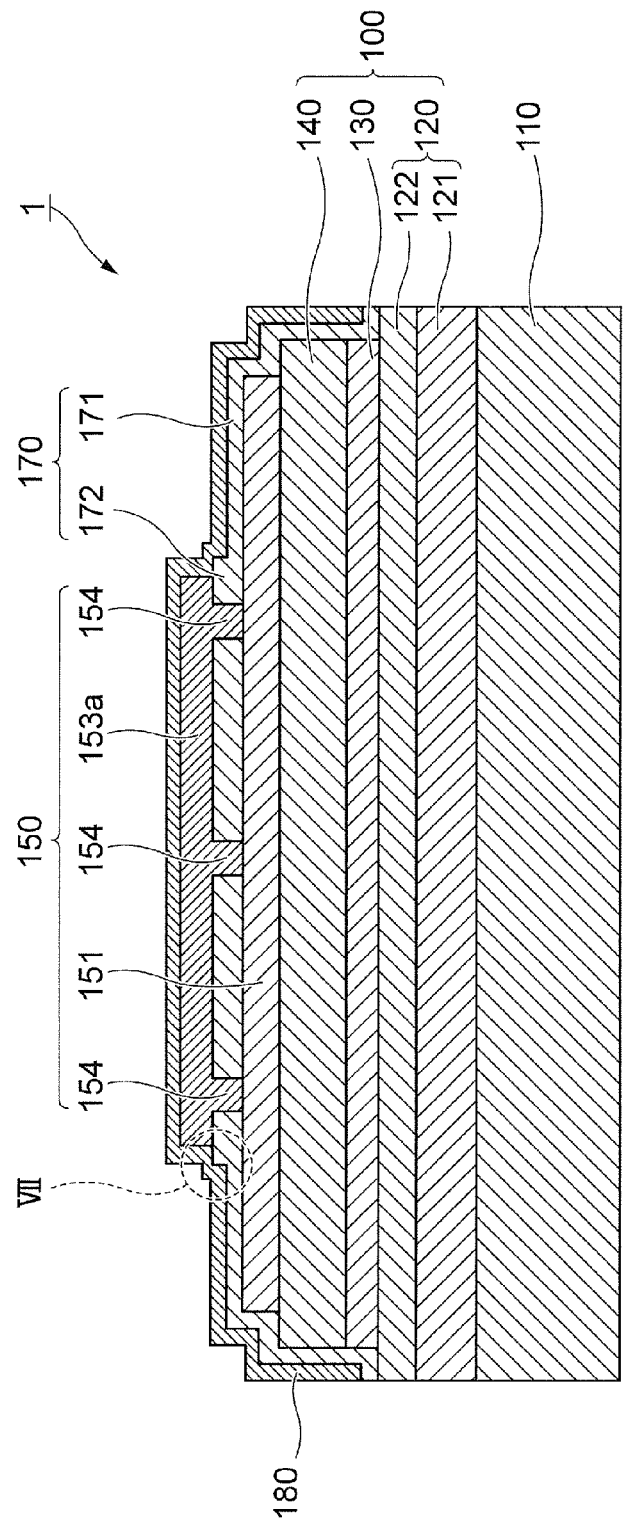
FIG. 2 is a II-II cross-sectional view in FIG. 1.
Figure 3:
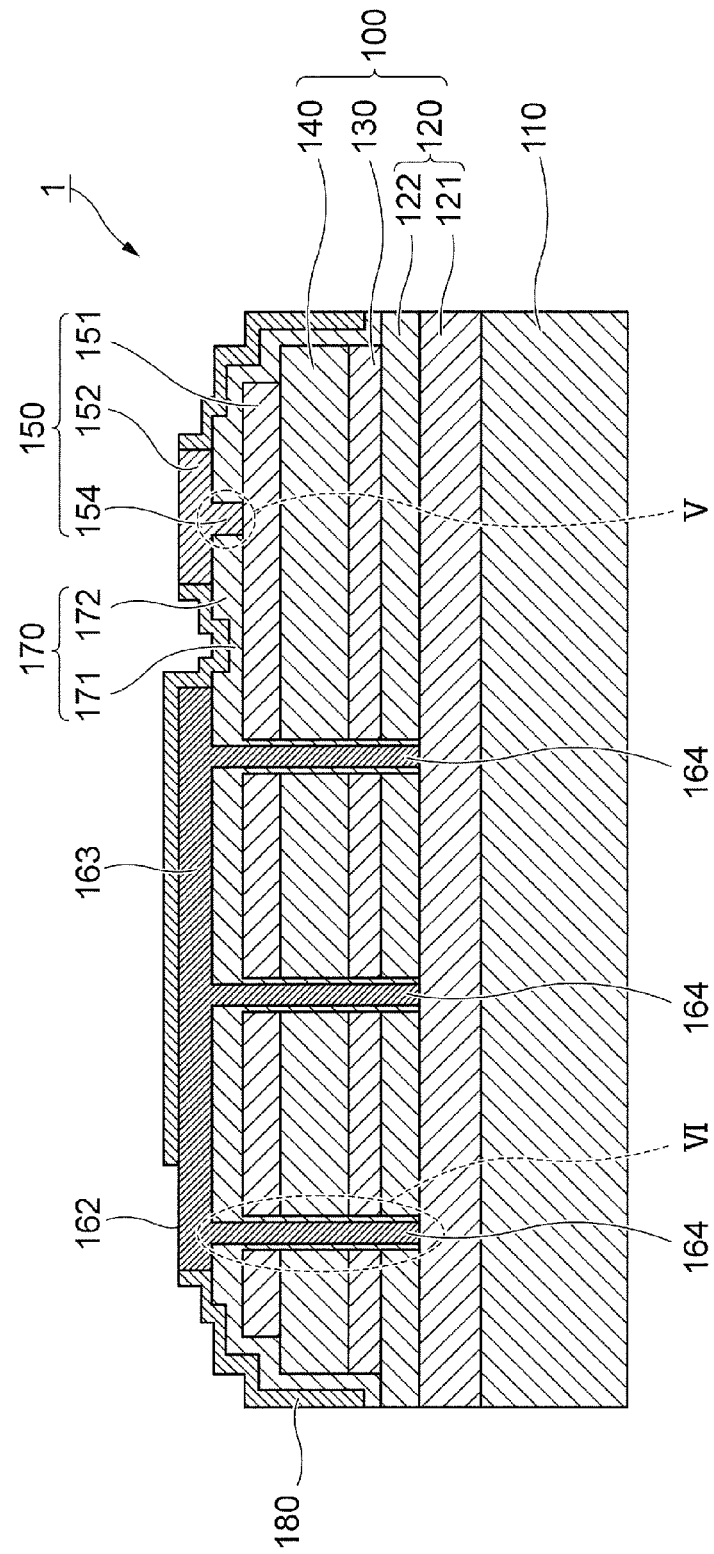
FIG. 3 is a III-III cross-sectional view in FIG. 1.
Figure 4:
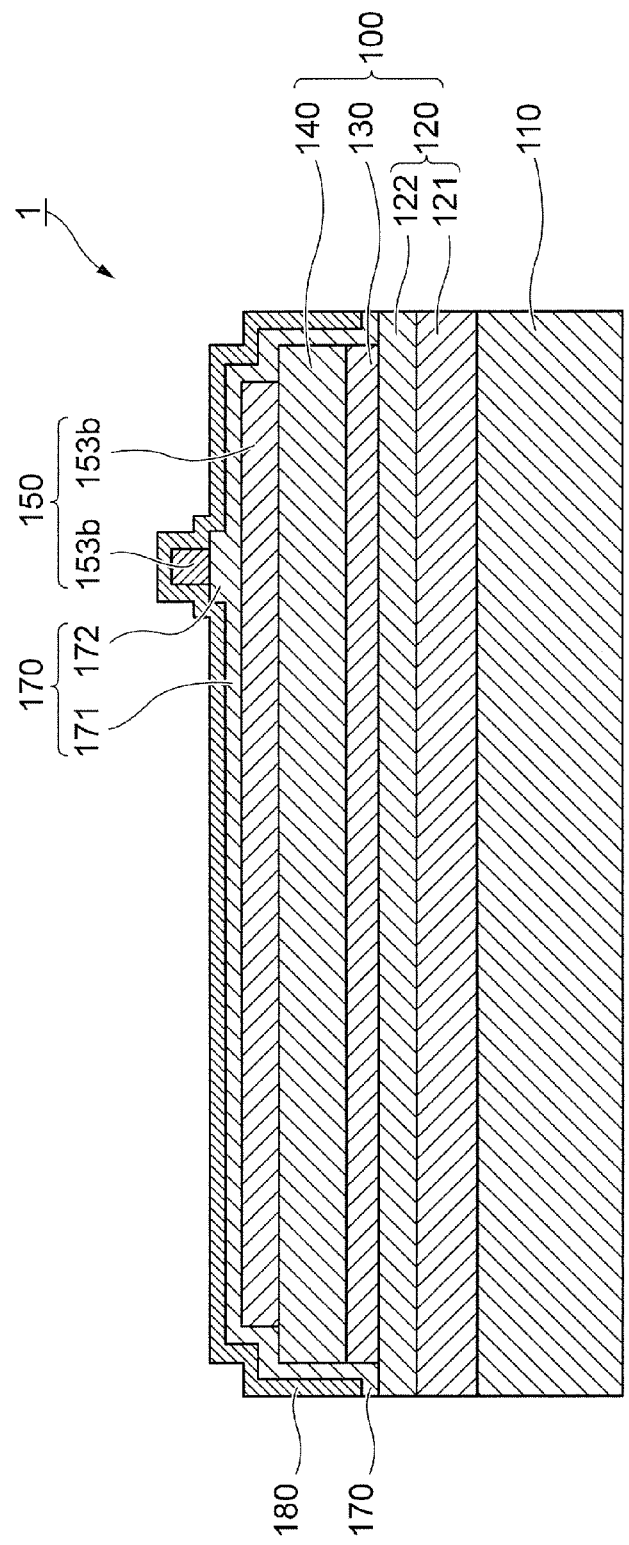
FIG. 4 is a IV-IV cross-sectional view in FIG. 1.

FIG. 1 is a diagram showing specific example of an upper surface of a semiconductor light emitting element 1 according to the first exemplary embodiment. FIG. 2 is a II-II cross-sectional view in FIG. 1, FIG. 3 is a III-III cross-sectional view in FIG. 1, and FIG. 4 is a IV-IV cross-sectional view in FIG. 1. Here, for example, the semiconductor light emitting element 1 of the present exemplary embodiment is rectangular in shape in the view from top side like shown in FIG. 1, the vertical direction of FIG. 1 is the short edge side and the cross direction of FIG. 1 is the long edge side. It should be noted that in the following description the vertical direction is referred to as the short direction and the cross direction is referred to as the longitudinal direction.

(Semiconductor Light Emitting Element)

The semiconductor light emitting element 1 of the present exemplary embodiment includes: a substrate 110; an n-type semiconductor layer 120 laminated on the substrate 110; a light emitting layer 130 laminated on the n-type semiconductor layer 120; and a p-type semiconductor layer 140 laminated on the light emitting layer 130. It should be noted that, in the following description, these n-type semiconductor layer 120, light emitting layer 130, and p-type semiconductor layer 140 will be collectively referred to as a laminated semiconductor layer 100 in some cases as necessary. Moreover, an intermediate layer (not shown in the figures) or a base layer (not shown in the figures) may be provided between the substrate 110 and the n-type semiconductor layer 120 as necessary.

Here, the n-type semiconductor layer 120 includes an n-contact layer 121 laminated on the substrate 110 and an n-cladding layer 122, which is laminated on the n-contact layer 121 and on which the light emitting layer 130 is laminated. Although details are not described here, it should be noted that the p-type semiconductor layer 140 may be configured to include a p-type cladding layer (not shown in the figures) laminated on the light emitting layer 130 and a p-type contact layer laminated on the p-type cladding layer.

Moreover, the semiconductor light emitting element 1 includes; a p-side power supply portion 150 electrically connected to the p-type semiconductor layer 140, and an n-side power supply portion 160 electrically connected to the n-type semiconductor layer 120. Further, between the p-side power supply portion 150 and the n-side power supply portion 160, the semiconductor light emitting element 1 includes; a power supply insulating layer 170 to electrically insulate the p-side power supply portion 150 and the n-side power supply portion 160 each other, and a protective insulating layer 180 that protects the light emitting layer 130 and the like from water which goes into inside of the semiconductor light emitting element 1 from outside and that electrically insulates the p-side power supply portion 150 and the n-side power supply portion 160 each other. It should be noted that, in FIG. 1, the description of the protective insulating layer 180 is omitted, which is actually positioned at an uppermost layer (at the most front side)

Here, the p-side power supply portion 150 includes; a p-side transparent conductive layer 151 which is laminated on the p-type semiconductor layer 140 and on which the power supply insulating layer 170 is laminated; a p-side power supply electrode 152 and a p-side auxiliary electrode 153 which are laminated on the power supply insulating layer 170; and plural p-side connective electrodes 154 (in this exemplary embodiment, seven) that electrically connect the p-side transparent conductive layer 151 with any one of the p-side power supply electrode 152 and the p-side auxiliary electrode 153 via holes penetrating through the power supply insulating layer 170.

In the p-side power supply portion 150 of the present exemplary embodiment, the p-side transparent conductive layer 151 is formed to cover the almost whole upper surface of the p-type semiconductor layer 140 except for peripheries thereof.

Moreover, in the p-side power supply portion 150 of the present exemplary embodiment, the p-side power supply electrode 152 as an example of a second power supply electrode is, on the top surface of the semiconductor light emitting element 1, arranged at one edge side in the longitudinal direction (the right side in FIG. 1) and at a center portion in the short direction, and has a circular shape in the view from top surface side. The protective insulating layer 180 is not laminated on the top surface of the p-side power supply electrode 152 (for example, refer to FIG. 3), and the p-side power supply electrode 152 is exposed outside. The p-side power supply electrode 152 is used for electronic connect to outside by using a not-shown bonding wire and the like.

Furthermore, in the p-side power supply portion 150 of the present exemplary embodiment, the p-side auxiliary electrode 153 includes: an L-shaped p-side first auxiliary electrode 153a which is integrated with the p-side power supply electrode 152 at the side of one edge and extends along the longitudinal direction of the semiconductor light emitting element 1 at the other edge side; and an L-shaped p-side second auxiliary electrode 153b which is integrated with the p-side power supply electrode 152 at the side of one edge and extends along the longitudinal direction of the semiconductor light emitting element 1 at the side of the other edge. Here, in the present exemplary embodiment, the p-side first auxiliary electrode 153a and the p-side second auxiliary electrode 153b do not make direct contact with each other by providing the p-side first auxiliary electrode 153a at the side of one edge in the short direction of the semiconductor light emitting element 1 (at the side of the upper part in FIG. 1) and the p-side second auxiliary electrode 153b at the side of the other edge in the short direction of the semiconductor light emitting element 1 (at the side of the lower part FIG. 1). The protective insulating layer 180 is laminated on the top surfaces of the p-side first auxiliary electrode 153a and the p-side second auxiliary electrodes 153b (for example, refer to FIG. 2 and FIG. 4). Also, in the present exemplary embodiment, one p-side connective electrode 154 is provided at the lower side of the p-side power supply electrode 152, three p-side connective electrodes 154 are provided at the lower side of the p-side first auxiliary electrode 153a, and three p-side connective electrodes 154 are provided at the lower side of the p-side second auxiliary electrode 153b, respectively.

On the other hand, the n-side power supply portion 160 includes; an n-side power supply electrode 162 and an n-side auxiliary electrode 163 which are laminated on the power supply insulating layer 170, and plural n-side connective electrodes 164 (in this exemplary embodiment, three) that electrically connect the n-contact layer 121 of the n-type semiconductor layer 120 with any one of the n-side power supply electrode 162 and the n-side auxiliary electrode 163 via holes penetrating through the p-side transparent conductive layer 151 of the p-side power supply portion 150, the p-type semiconductor layer 140, the light emitting layer 130, and the n-cladding layer 122 of the n-type semiconductor layer 120.

In the n-side power supply portion 160 of the present exemplary embodiment, the n-side power supply electrode 162 as an example of a first power supply electrode is, on the top surface of the semiconductor light emitting element 1, arranged at the other edge side in the longitudinal direction (the left side in FIG. 1) and at a center portion in the short direction, and has a circular shape in the view from top surface side. The protective insulating layer 180 is not laminated on the top surface of the n-side power supply electrode 162 (for example, refer to FIG. 3), and the n-side power supply electrode 162 is exposed outside. The n-side power supply electrode 162 is used for electronic connect to outside by using a not-shown bonding wire and the like.

Moreover, in the n-side power supply portion 160 of the present exemplary embodiment, one n-side auxiliary electrode 163 as an example of a first auxiliary electrode that is integrated with the n-side power supply electrode 162 at the side of one edge and extends along the longitudinal direction of the semiconductor light emitting element 1 at the side of the other edge toward the p-side power supply electrode 152 is provided. Thus the n-side auxiliary electrode 163 is provided in the area between the p-side first auxiliary electrode 153a and the p-side second auxiliary electrode 153b in the p-side power supply portion 150. The protective insulating layer 180 is laminated on the top surface of the n-side auxiliary electrode 163 (for example, refer to FIG. 3). Also in the present exemplary embodiment, one n-side connective electrode 164 is provided at the lower side of the n-side power supply electrode 162, and the two n-side connective electrodes 164 are provided at the lower side of the n-side auxiliary electrode 163 respectively.

Here, the above-described power supply insulating layers 170 are provided at the respective side walls of plural holes provided to correspond to the respective n-side connective electrodes 164 as an example of a first connective electrode. Therefore, the respective n-side connective electrodes 164 do not make direct contact with at least the p-side transparent conductive layer 151, p-type semiconductor layer 140, and the light emitting layer 130. On the other hand, the power supply insulating layers 170 are not provided on the respective lower edge portions in the plural holes and the respective n-side connective electrodes 164 and the n-contact layer 121 are directly contacted.

In the present exemplary embodiment, for instance, in the view of the top surface side as shown in FIG. 1, two p-side connective electrodes 154 and one n-side connective electrode 164 are provided to form a shape of a triangular, or the one p-side connective electrode 154 and the two n-side connective electrodes 164 are provided to form a shape of a triangular. It should be noted that in the semiconductor light emitting element 1, the positions of the p-side power supply portion 150 (p-side transparent conductive layer 151, p-side power supply electrode 152, p-side auxiliary electrode 153 and the p-side connective electrode 154) and the n-side power supply portion 160 (n-side power supply electrode 162, n-side auxiliary electrode 163 and n-side connective electrode 164) are decided not to be directly contact each other.

Moreover, the power supply insulating layer 170 includes: a thick-film portion 172 provided on the portion at the lower side of the p-side power supply electrode 152 and the p-side auxiliary electrode 153 which configure the p-side power supply portion 150, and also on the portion at the lower side of the n-side power supply electrode 162 and the n-side auxiliary electrode 163 which configure the n-side power supply portion 160; and a thin-film portion 171 that is provided on the portions except for the thick-film portions 172 and has a thickness thinner than that of the thick-film portion 172. It should be noted that the relationship between the thin-film portion 171 and the thick-film portion 172 in the power supply insulating layer 170 will be described below.

Further, the protective insulating layer 180 covers the upper surface of the semiconductor light emitting layer 1, except for the p-side power supply electrode 152 of the p-side power supply portion 150 and the n-side power supply electrode 162 of the n-side power supply portion 160.

It should be noted that, in the semiconductor light emitting layer 1 of the present exemplary embodiment, as shown in FIG. 2 to FIG. 4, the power supply insulating layer 170 and the protective insulating layer 180 cover the side surfaces of the light emitting layer 130 and the p-type semiconductor layer 140.

In the semiconductor light emitting element 1, the light emitting layer 130 is configured to emit light by setting the p-side power supply electrode 152 of the p-side power supply portion 150 as a positive electrode and the n-side power supply electrode 162 of the n-side power supply portion 160 as a negative electrode to flow a current from the p-side power supply electrode 152 to the n-side power supply electrode 162.

The semiconductor light emitting element 1 of the present exemplary embodiment is a light emitting diode of a face-up type in which light emitted from the light emitting layer 130 is extracted from the side on which the p-side power supply portion 150 and the n-side power supply portion 160 are formed. Here, in the semiconductor light emitting element 1 of the present exemplary embodiment, the p-side transparent conductive layer 151, the p-side power supply electrode 152, p-side auxiliary electrode 153 and the p-side connective electrode 154 which configure the p-side power supply portion 150, and the n-side power supply electrode 162 and the n-side auxiliary electrode 163 which configure the n-side power supply portion 160 are provided in the inner side beyond the p-type semiconductor layer 140 in the view from the light emitting layer 130. In another point of view, in the semiconductor light emitting element 1 of the present exemplary embodiment, the light emitting layer 130 is provided at the lower side of the p-side transparent conductive layer 151, p-side power supply electrode 152, p-side auxiliary electrode 153, and the p-side connective electrode 154 which configure the p-side power supply portion 150, and at the lower side of the n-side power supply electrode 162 and the n-side auxiliary electrode 163 which configure the n-side power supply portion 160 (however, except for the lower side of the forming portion of the n-side connective electrode 164).

Next, each component of the semiconductor light emitting element 1 will be described in more detail with reference to FIG. 1 to FIG. 4.

It should be noted that, in the following description, AlGaN, GaN and GaInN as specific examples of a compound semiconductor and a group III nitride semiconductor are described with the compositional ratio of each element being omitted in some cases.

<Substrate>

The substrate 110 can be selected to be used from various kinds of substrate materials without any limitation as long as group III nitride semiconductor crystals are epitaxially grown on a surface thereof. For example, substrate materials composed of sapphire, SiC, GaN, silicon or the like can be used.

Moreover, among the above-described materials, a transparent substrate is preferable, and in particular, it is preferable to use sapphire whose chamfer is a principal surface as the substrate 110 in view of quality and cost. In the case of using sapphire as the substrate 110, it is preferable to configure an intermediate layer (a buffer layer) by processing the surface to rough on the C-plate surface of sapphire.

<Intermediate Layer>

The intermediate layer is preferably composed of polycrystal $Al_xGa_{1-x}N$ (0≤x≤1), and more preferably, composed of single crystal $Al_xGa_{1-x}N$ (0≤x≤1). For example, the intermediate layer can be composed of polycrystal $Al_xGa_{1-x}N$ (0≤x≤1) with a thickness of 10 nm to 500 nm. It should be noted that the intermediate layer has a function of mediating the difference in lattice constant between the substrate 110 and the base layer described later to facilitate the formation of a single crystal layer which is c-axis oriented on the (0001) surface (chamfer) of the substrate 110. Therefore, the laminated semiconductor layer 100 having more excellent crystallinity can be obtained by laminating the single crystal base layer on the intermediate layer.

<Base Layer>

As the base layer, $Al_xGa_yIn_zN$ (0≤x≤1, 0≤y≤1, 0≤z≤1, x+y+z=1) can be used, but it is preferable to use $Al_xGa_{1-x}N$ (0≤x≤1) because the base layer with excellent crystallinity can be formed.

The thickness of the base layer 130 is preferably 0.1 μm or more. The $Al_xGa_yIn_zN$ layer having excellent crystallinity is likely to be obtained with these layer thickness or more. The base layer preferably has the thickness which can flatten the rough of the above-described rough processed substrate. Furthermore, the thickness of the base layer is preferably 10 μm or less.

<Laminated Semiconductor Layer>

The laminated semiconductor layer 100 including a group III nitride semiconductor is configured by laminating the n-type semiconductor layer 120, the light emitting layer 130, and the p-type semiconductor layer 140 on the substrate 110 in this order as shown in FIG. 2 to FIG. 4. Each layer of the n-type semiconductor layer 120, the light emitting layer 130, and the p-type semiconductor layer 140 may be configured by plural semiconductors.

Here, the n-type semiconductor layer 120 as an example of a first semiconductor layer performs electric conduction by setting an electron is a carrier, while the p-type semiconductor layer 140 as an example of a second semiconductor layer performs electric conduction by setting a hole is a carrier. In this exemplary embodiment, the n-type in which an electron is a carrier corresponds to the first conductive type, while the p-type in which a hole is a carrier corresponds to the second conductive type.

<N-Type Semiconductor Layer>

The n-type semiconductor layer 120 includes the n-contact layer 121 laminated on the substrate 110 (the base layer in this exemplary embodiment) and the n-cladding layer 122, which is laminated on the n-contact layer 121. The n-contact layer 121 can serve as the n-cladding layer 122. It should be noted that the above-described base layer may be included in the n-type semiconductor layer 120.

Of these, the n-contact layer 121 is a layer for providing the n-side power supply portion 160 (more specifically, the n-side connective electrodes 164). The intermediate layer is preferably composed of polycrystal $Al_xGa_{1-x}N$ layer (0≤x≤1, preferably 0≤x≤0.5, more preferably 0≤x≤0.1) may be used as the n-contact layer 121.

The n-cladding layer 122 performs injection of the carriers (the electrons here) into the light emitting layer 130 and confinement of the carriers. In the present exemplary embodiment, the n-cladding layer 122 can be formed of AlGaN, GaN, GaInN and the like. Further, the hetero junction structure or the superlattice structure in which the layer is laminated plural times of these structures may also be used. When the n-cladding layer 122 is formed of GaInN, the band gap thereof is preferably larger than that of GaInN of the light emitting layer 130 described later.

It should be noted that, in the case where the n-cladding layer 122 is a layer containing the superlattice structure, the layer may contain a structure in which an n-side first cladding layer composed of the group III nitride semiconductor with a thickness of 10 nm or less and an n-side second cladding layer having a different composition from the n-side first cladding layer and composed of the group III nitride semiconductor with a thickness of 10 nm or less are laminated.

Further, the n-cladding layer 122 may contain a structure in which the n-side first cladding layers and the n-side second cladding layers are alternately and repeatedly laminated, and the structure is preferably an alternating structure of GaInN and GaN or an alternating structure of GaInN having different compositions.

<Light Emitting Layer>

As the light emitting layer 130, a single quantum well structure or a multiple quantum well structure can be employed.

As a well layer having a quantum well structure, the group III nitride semiconductor layer composed of $Ga_{1-y}In_yN$ ($0<y<0.4$) is usually used. The thickness of the well layer may be the thickness by which quantum effects can be obtained, for example, 1 nm to 10 nm, and is preferably 2 nm to 6 nm in terms of light emission output.

Moreover, in the case of the light emitting layer 130 having the multiple quantum well structure, the above-described $Ga_{1-y}In_yN$ is employed as the well layer, and $Al_zGa_{1-z}N$ ($0\leq z<0.3$) having a band gap energy larger than that of the well layer is employed as a barrier layer. The well layer and the barrier layer may be doped or not doped with impurities depending upon a design thereof.

<P-Type Semiconductor Layer>

The p-type semiconductor layer 140 is preferably configured with the p-cladding layer laminated on the light emitting layer 130 and the p-contact layer laminated on the p-cladding layer. The p-contact layer can also serve as the p-cladding layer.

The p-cladding layer performs confinement of carriers (here, holes) within the light emitting layer 130 and injection of carriers. The p-cladding layer is not particularly limited as long as the band gap energy of the composition thereof is larger than that of the light emitting layer 130 and carriers can be confined within the light emitting layer 130, but is preferably composed of $Al_xGa_{1-x}N$ ($0<x\leq0.4$).

It is preferable that the p-cladding layer is composed of such AlGaN in terms of confinement of carriers within the light emitting layer 130. The thickness of the p-cladding layer is not particularly limited, but preferably 1 nm to 400 nm, and more preferably 5 nm to 100 nm.

Further, similarly to the above-described n-cladding layer 122, the p-cladding layer may have a superlattice structure in which the layer is laminated plural times of these structures, and preferably has an alternating structure of AlGaN and AlGaN with different composition or an alternating structure of AlGaN and GaN.

The p-contact layer is a layer for providing the p-side power supply portion 150 (specifically, the p-side transparent conductive layer 151). The p-contact layer is preferably composed of $Al_xGa_{1-x}N$ ($0\leq x\leq0.4$). It is preferable that Al composition is in the above-described range in terms of allowing to maintain excellent crystallinity and good ohmic contact with the p-side transparent conductive layer 151.

The thickness of the p-contact layer is not particularly limited, but is preferably 10 nm to 500 nm, and more preferably 50 nm to 200 nm. It is preferable to provide the thickness of the p-contact layer in these ranges in the point that the forward voltage Vf can be reduced.

<P-Side Power Supply Portion 150>

Figure 5:
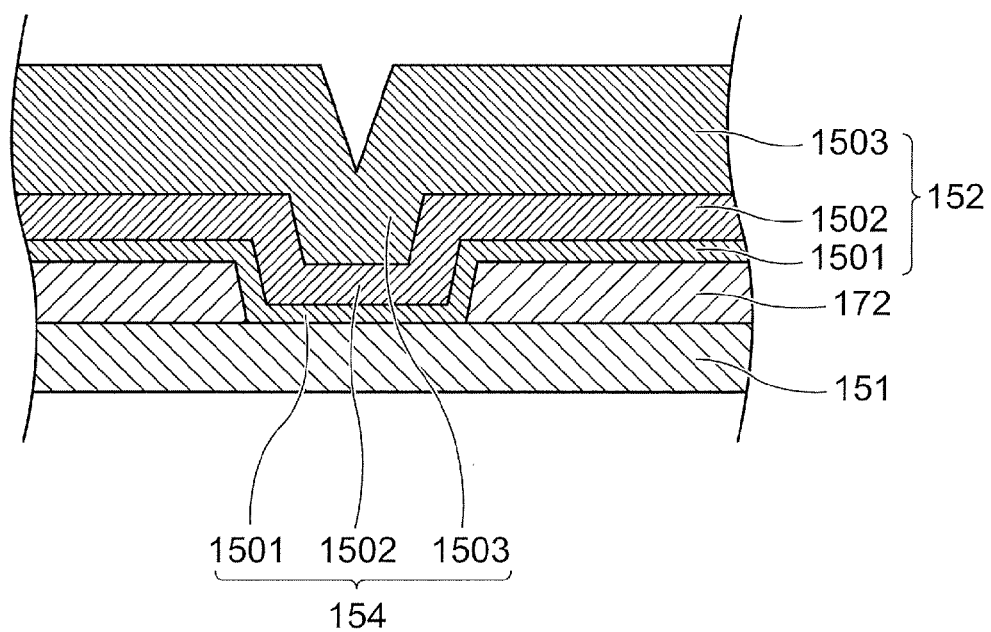
FIG. 5 is a diagram showing a specific example of a configuration of the p-side power supply portion of a semiconductor light emitting element according to the first exemplary embodiment.

FIG. 5 is a diagram showing specific example of a configuration of the p-side power supply portion 150 according to the first exemplary embodiment. Here, FIG. 5 shows an enlarged cross-sectional view of a region V shown in FIG. 3, that is, an interface portion between the p-side power supply electrode 152 and the p-side connective electrode 154. It should be noted that the p-side auxiliary electrode 153 which configures the p-side power supply portion 150 together with the p-side power supply electrode 152 and the p-side connective electrode 154, and the p-side connective electrode 154 provided at the side of the p-side auxiliary electrode 153 (refer to FIG. 2) have the configuration in common.

[P-Side Transparent Conductive Layer]

The p-side transparent conductive layer 151 is formed to cover almost of all but an edge portion of the top surface of the p-type semiconductor layer 140.

As the p-side transparent conductive layer 151, it is preferable to employ those that can make an ohmic contact with the p-type semiconductor layer 140 and has small contact resistance with the p-type semiconductor layer 140. Further, in the semiconductor light emitting element 1, since the light from the light emitting layer 130 is emitted to the protective insulating layer 180 side via the p-side transparent conductive layer 151, it is preferable to employ those having excellent optical permeability as the p-side transparent conductive layer 151. Still further, for uniformly passing a current over the entire surface of the p-type semiconductor layer 140, it is preferable to use the p-side transparent conductive layer 151 having excellent conductivity and narrow resistance distribution.

It should be noted that the thickness of the p-side transparent conductive layer 151 can be selected from the range of 2 nm to 500 nm. Here, if the thickness of the p-side transparent conductive layer 151 is less than 2 nm, there are some cases where an ohmic contact with the p-type semiconductor layer 140 is hardly available, and if the thickness of the p-side transparent conductive layer 151 is more than 500 nm, there are some cases that are not preferable in terms of optical permeability to the light emitted from the light emitting layer 130.

As the p-side transparent conductive layer 151, for example, an oxide conductive material having excellent optical permeability to the light of a wavelength emitted from the light emitting layer 130 is used. The optical permeability to the light of a wavelength emitted from the light emitting layer 130 is preferably 90% or more, and desirably 95% or more. In particular, part of oxides containing In is preferable in the point that both optical permeability and conductivity thereof are superior to other transparent conductive films. Examples of conductive oxides containing In include: IZO (indium zinc oxide ($In_2O_3$—ZnO)); ITO (indium tin oxide ($In_2O_3$—$SnO_2$)); IGO (indium gallium oxide ($In_2O_3$—$Ga_2O_3$)); and ICO (indium cerium oxide ($In_2O_3$—$CeO_2$)). It should be noted that a dopant such as fluorine may be added to these materials. Further, for example, oxides not containing In, such as carrier-doped $SnO_2$, $ZnO_2$ and $TiO_2$ may be employed.

The p-side transparent conductive layer 151 can be formed by providing these materials by any well-known method in this technical field. Moreover, by performing thermal annealing after forming the p-side transparent conductive layer 151 to promote crystallization, the optical permeability of the p-side transparent conductive layer 151 is improved and sheet resistance is reduced, thereby an ohmic contact is likely to be obtained.

In the exemplary embodiment, as the p-side transparent conductive layer 151, those having a crystallized structure may be used, and in particular, a transparent material containing $In_2O_3$ crystals having a crystal structure of a hexagonal system or a bixbyite structure (for example, IZO or ITO) can be preferably used.

Further, as the film used for the p-side transparent conductive layer 151, it is preferable to use a composition showing the lowest specific resistance. For example, a ZnO concentration in IZO is preferably 1% by mass to 20% by mass, and more preferably in a range of 5% by mass to 15% by mass, and 10% by mass is especially preferred.

Still further, in terms of increasing the contact property between the obtained films, the p-side transparent conductive layer 151 may be formed by sputtering method, for example.

[P-Side Power Supply Electrode, p-Side Auxiliary Electrode and p-Side Connective Electrode]

The p-side power supply electrode 152, the p-side auxiliary electrode 153, and the p-side connective electrode 154 in the p-side power supply portion 150 are configured by laminating a p-side first power supply layer 1501, a p-side second power supply layer 1502, and a p-side third power supply layer 1503 in the order of being adjacent to the p-side transparent conductive layer 151 to be connected with. In the present exemplary embodiment, the p-side first power supply layer 1501 is composed of TaN, the p-side second power supply layer 1502 is composed of Pt, and the p-side third power supply layer 1503 is composed of Au. The thickness of the p-side first power supply layer 1501 is approximately 1 nm; the thickness of the p-side second power supply layer 1502 is approximately 100 nm, and the thickness of the p-side third power supply layer 1503 is approximately 1000 nm.

Among these, the p-side first power supply layer 1501 has electronic conductivity and functions as an adhere layer which increases the adherence with the power supply insulating layer 170. The p-side second power supply layer 1502 has electronic conductivity and functions as a diffusion prevention layer which prevents TaN constituting the p-side first power supply layer 1501 from diffusing toward the side of the p-side third power supply layer 1503, and Au constituting the p-side third power supply layer 1503 from diffusing toward the side of the p-side first power supply layer 1501. Moreover, the p-side third power supply layer 1503 has electronic conductivity and chemical stability, and functions as a surface layer used for the electronic connect to outside in the p-side power supply electrode 152, for example.

In the present exemplary embodiment, the p-side connective electrode 154 is circular in shape in the view from top side (refer to FIG. 1), and the diameter of the circle is approximately 10 μm and the circle has a tapered cross-sectional shape where the diameter gets smaller as the p-side transparent conductive layer 151 gets close. The inclination angle of the side wall in the p-side connective electrode 154 is approximately 80 degrees.

<N-Side Power Supply Portion 160>

Figure 6:
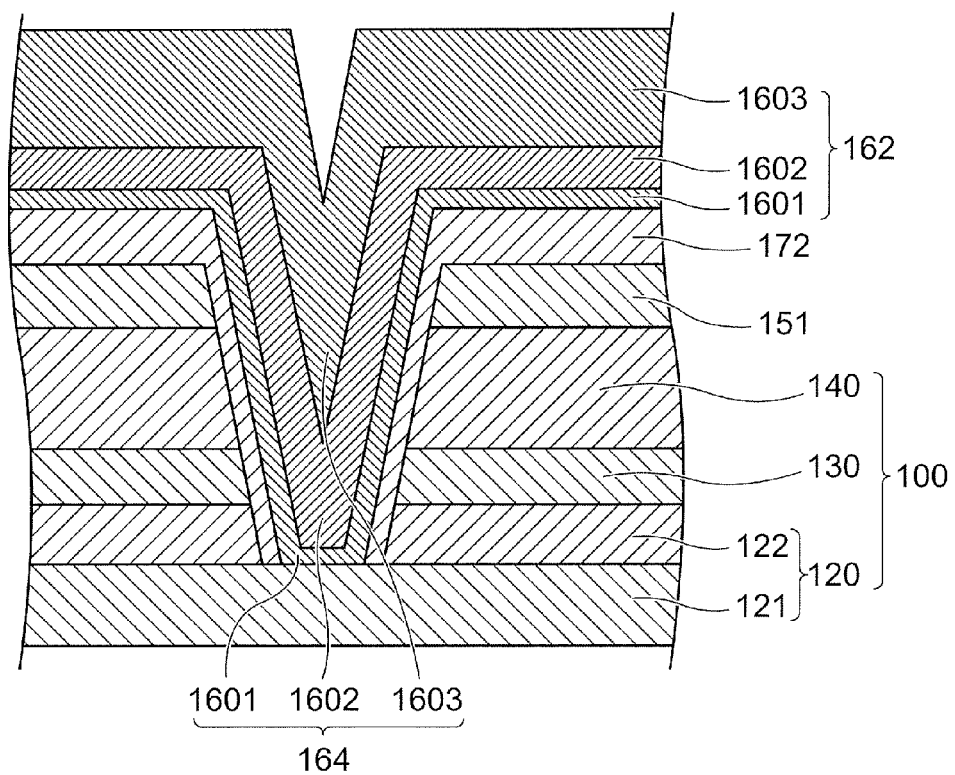
FIG. 6 is a diagram showing a specific example of a configuration of the n-side power supply portion of a semiconductor light emitting element according to the first exemplary embodiment.

FIG. 6 is a diagram showing specific example of a configuration of the n-side power supply portion 160 according to the first exemplary embodiment. Here, FIG. 6 shows an enlarged cross-sectional view of a region VI shown in FIG. 3, that is, an interface portion between the n-side power supply electrode 162 and the n-side connective electrode 164. It should be noted that the n-side auxiliary electrode 163 which configures the n-side power supply portion 160 together with the n-side power supply electrode 162 and the n-side connective electrode 164, and the n-side connective electrode 164 provided at the side of the n-side auxiliary electrode 163 (refer to FIG. 3) have the configuration in common.

[N-Side Power Supply Electrode, n-Side Auxiliary Electrode and n-Side Connective Electrode]

The n-side power supply electrode 162, the n-side auxiliary electrode 163, and the n-side connective electrode 164 in the n-side power supply portion 160 are configured by laminating an n-side first power supply layer 1601, an n-side second power supply layer 1602, and an n-side third power supply layer 1603 in the order of being adjacent to the n-contact layer 121 in the n-type semiconductor layer 120 to be connected with. In present exemplary embodiment, the n-side first power supply layer 1601 is composed of TaN, the n-side second power supply layer 1602 is composed of Pt, and the n-side third power supply layer 1603 is composed of Au. The thickness of the n-side first power supply layer 1601 is approximately 1 nm; the thickness of the n-side second power supply layer 1602 is approximately 100 nm, and the thickness of the n-side third power supply layer 1603 is approximately 1000 nm.

Among these, the n-side first power supply layer 1601 has electronic conductivity and functions as an adhere layer which increases the adherence with the power supply insulating layer 170. The n-side second power supply layer 1602 has electronic conductivity and functions as a diffusion prevention layer which prevents TaN constituting the n-side first power supply layer 1601 from diffusing toward the side of the n-side third power supply layer 1603, and Au constituting the n-side third power supply layer 1603 from diffusing toward the side of the n-side first power supply layer 1601. Moreover, the n-side third power supply layer 1603 has electronic conductivity and chemical stability, and functions as a surface layer used for the electronic connect to outside in the n-side power supply electrode 162, for example.

As described above, in the present exemplary embodiment, the p-side power supply electrode 152, the p-side auxiliary electrode 153 and the p-side connective electrode 154 in the p-side power supply portion 150; and the n-side power supply electrode 162, the n-side auxiliary electrode 163, and the n-side connective electrode 164 in the n-side power supply portion 160 have the configuration in common.

In the present exemplary embodiment, the n-side connective electrode 164 is circular in shape in the view from top side (refer to FIG. 1), and the diameter of the circle is approximately 10 μm and the circle has a tapered cross-sectional shape where the diameter gets smaller as the n-contact layer 121 gets close. The inclination angle of the side wall in the n-side connective electrode 164 is approximately 80 degrees.

<Power Supply Insulating Layer>

Figure 7:
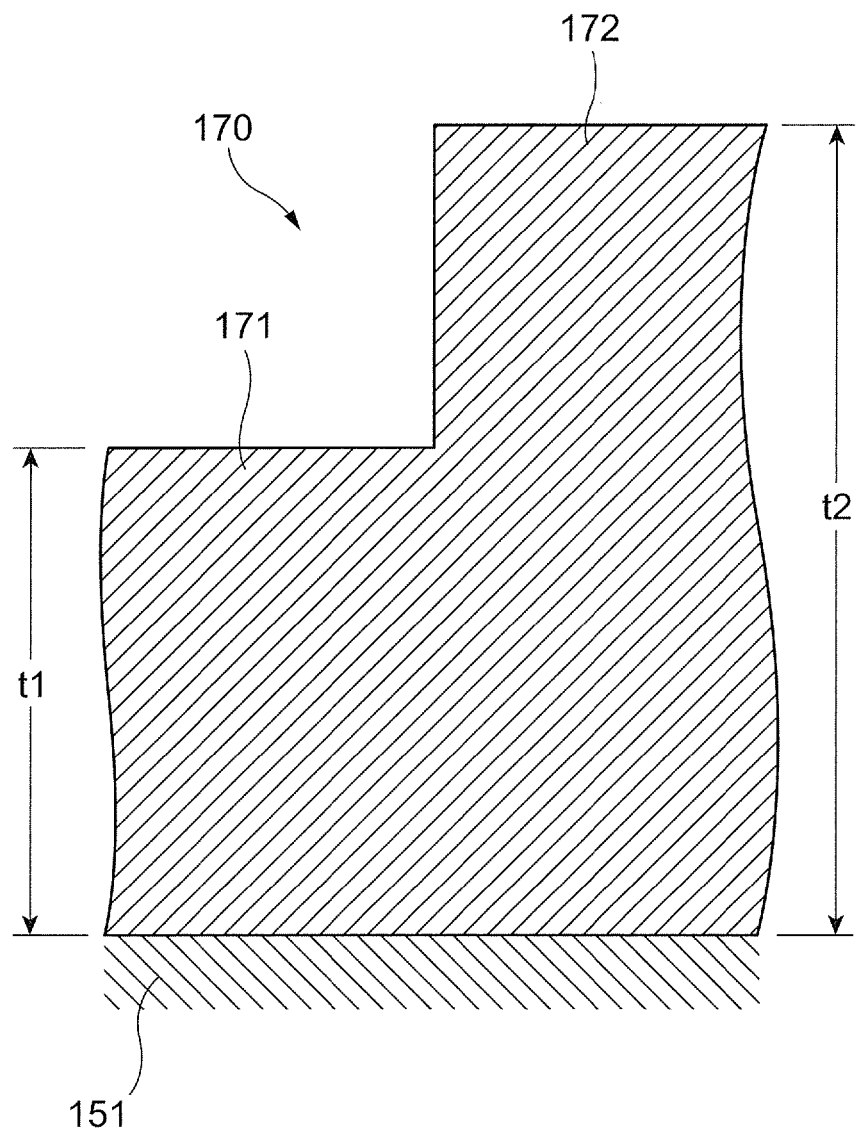
FIG. 7 is a diagram showing a specific example of a configuration of the power supply insulating layer.

FIG. 7 is a diagram showing specific example of a configuration of the power supply insulating layer 170 shown in FIG. 1 to FIG. 4. Here, FIG. 7 shows an enlarged cross-sectional view of a region VII shown in FIG. 2. It should be noted that, in FIG. 7, the p-side transparent conductive layer 151 provided at the lower side of the power supply insulating layer 170 is shown, on the other hand, each layer provided at the upper side of the power supply insulating layer 170 is omitted.

In the present exemplary embodiment, the power supply insulating layer 170 as an example of a transparent insulating layer has optical permeability to the light emitted from the light emitting layer 130 and insulating properties to electrically insulate the p-side power supply portion 150 and the n-side power supply portion 160. As a material constituting the power supply insulating layer 170, for example, $SiO_2$ (silicone dioxide), $MgF_2$ (magnesium fluoride), $CaF_2$ (calcium fluoride), Si$_3$N$_4$ (silicone nitride), Al$_2$O$_3$ (aluminum oxide) can be used. It should be noted that SiO$_2$ (silicone dioxide), which has high insulating properties and low refraction index (1.4 to 1.5) and is superior in terms of wet resistance, is used as the power supply insulating layer 170 in this specific example.

Moreover, the power supply insulating layer 170 of the present exemplary embodiment, as described-above, includes: the thin-film portion 171 as an example of a first transparent insulating portion; and the thick-film portion 172 as an example of a second transparent insulating portion. Here, when it is assumed that the thickness of the thin-film portion 171 is a first thickness t1 and the thickness of the thick-film portion 172 is a second thickness t2, the first thickness t1 and the second thickness t2 have the relationship of t1<t2. In the power supply insulating layer 170, the first thickness t1 of the thin-film portion 171 is selected from values which are not likely to cause a total reflection in a wavelength of the light emitted from the light emitting layer 130. On the other hand, the second thickness t2 of the thick-film portion 172 is selected from values which are likely to cause a total reflection in a wavelength of the light emitted from the light emitting layer 130. Therefore, the first thickness t1 and the second thickness t2 possibly have a relationship of t1>t2. It should be noted that in the present exemplary embodiment, the first thickness t1 is set at 87 nm and the second thickness t2 is set at 150 nm respectively by the wavelength of the light emitted from the light emitting layer 130 being 450 nm and the power supply insulating layer 170 having the above-described reflection rate.

Further, the power supply insulating layer 170 of the present exemplary embodiment does not only electrically insulate the p-side power supply portion 150 and n-side power supply portion 160 but also has a function of electrically insulating the n-side power supply portion 160 from the p-type semiconductor layer 140 and the light emitting layer 130. The power supply insulating layer 170 has a function of diffusing positions of power supply from the p-side power supply portion 150 to the p-type semiconductor layer 140.

<Protective Insulating Layer>

In the present exemplary embodiment, the protective insulating layer 180 has optical permeability to the light emitted from the light emitting layer 130 and insulating properties to electrically insulate the p-side power supply portion 150 and the n-side power supply portion 160. As a material constituting the protective insulating layer 180, for example, SiO$_2$ (silicone dioxide), MgF$_2$ (magnesium fluoride), CaF$_2$ (calcium fluoride), Si$_3$N$_4$ (silicone nitride), Al$_2$O$_3$ (aluminum oxide) can be used. It should be noted that SiO$_2$ (silicone dioxide) is used as the protective insulating layer 180 in this specific example, as well as the power supply insulating layer 170. Here, the thickness of the protective insulating layer 180 is preferably approximately 90 nm.

(Light Emitting Device)

Figure 8A:
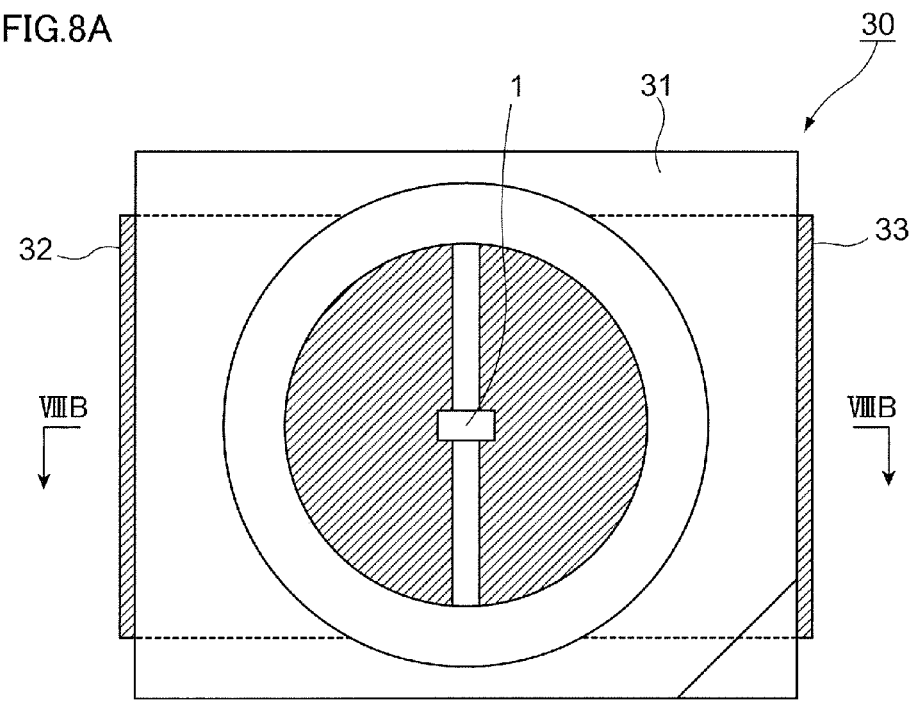
FIGS. 8A and 8B are diagrams showing specific examples of a configuration of the light emitting device on which the semiconductor light emitting element is mounted.
Figure 8B:
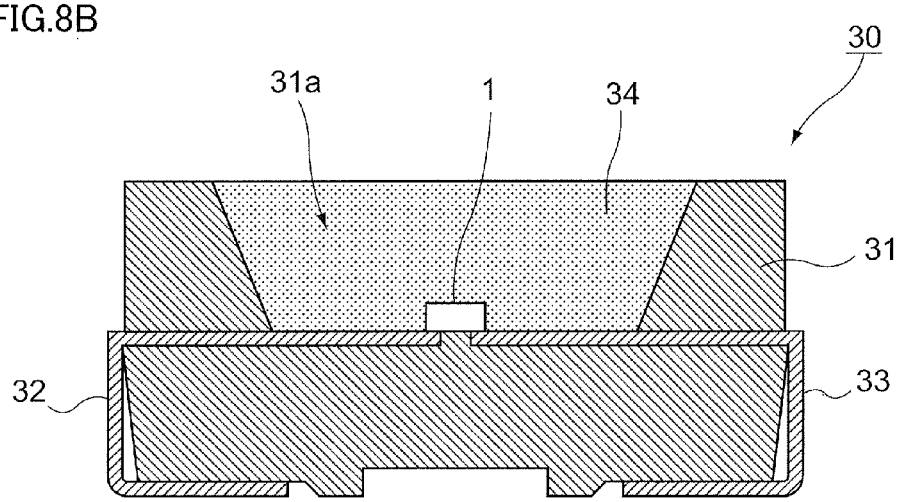

FIGS. 8A and 8B are diagrams showing specific examples of a configuration of a light emitting device 30 on which the semiconductor light emitting element 1 is mounted. Here, FIG. 8A shows a top surface view of the light emitting device 30, and FIG. 8B is a VIIIB-VIIIB cross-sectional view in FIG. 8A. It should be noted that the light emitting device 30 shown in FIGS. 8A and 8B is referred to as "light emitting chip", or "lamp" in some cases.

The light emitting device 30 includes: a housing 31, on one side of which a concave section 31a is formed; a p-lead section 32 and an n-lead section 33 composed of lead frames formed in the housing 31; the semiconductor light emitting element 1 attached to a bottom surface of the concave section 31a; and a sealing section 34 provided to cover the concave section 31a. It should be noted that an illustration of the sealing section 34 is omitted in FIG. 8A.

The housing 31 as a specific example of the base section is formed by injection molding of a white thermoplastic resin on a metal lead section including the p-lead section 32 as a specific example of a second wiring and the n-lead section 33 as a specific example of a first wiring.

The p-lead section 32 and the n-lead section 33 are metal plates having a thickness of the order of 0.1 mm to 0.5 mm, and configured by laminating several μm of nickel, titanium, gold or silver as a plating layer on an alloy of iron and copper, for example, which is a metal having excellent workability and thermal conductivity, as a base. Then, in the exemplary embodiment, part of each of the p-lead section 32 and the n-lead section 33 is exposed at the bottom surface of the concave section 31a. Further, one end portion of each of the p-lead section 32 and the n-lead section 33 is exposed to the outside of the housing 31 and is bent from an outer wall surface toward a back surface side of the housing 31.

The semiconductor light emitting element 1 is attached by bonding or the like to the center portion of the bottom portion in the concave section 31a via the substrate 110 (refer to FIG. 2). Further, the p-lead section 32 and the p-side power supply electrode 152 (refer to FIG. 1) in the semiconductor light emitting element 1 are electrically connected by the not-shown bonding wire, and the n-lead section 33 and the n-side electrode 180 (refer to FIG. 1) in the semiconductor light emitting element 1 are electrically connected by the not-shown bonding wire.

The sealing section 34 is configured with a transparent resin having high optical permeability in a visible region wavelength. As the resin constituting the sealing section 34, which satisfies the properties of high heat resistance, high weather resistance and high mechanical strength, for example, an epoxy resin or a silicone resin can be used. In the present exemplary embodiment, a transparent plastic constituting the sealing section 34 contains a fluorescence body converts a part of the light emitted from the semiconductor light emitting element 1 into green light and red light. It should be noted that, in place of such the fluorescence body, the transparent plastic may contain a fluorescence body converts a part of blue light into yellow light or a fluorescence body converts a part of blue light into yellow light and red light. Also a transparent plastic containing no fluorescence body may be used as the sealing section 34.

It should be noted that an electronic appliance, such as a backlight, a mobile cellular telephone, a display, various kinds of panels and the like, a computer, a game machine and illumination incorporating the light emitting device 30 according to the exemplary embodiment, and a mechanical device incorporating those electronic appliances, such as an automobile, is equipped with the semiconductor light emitting element 1 having excellent light emitting properties. Especially, in the electronic appliance, such as the backlight, the mobile cellular telephone, the display, the game machine and the illumination, which are battery-powered, an excellent product equipped with the semiconductor light emitting element 1 having excellent light emitting properties can be provided; and therefore, it is favorable. In addition, the configuration of the light emitting device 30 including the semiconductor light emitting element 1 is not limited to that shown in FIGS. 8A and 8B, and a package configuration called, for example, a shell type may be employed.

Then, description will be given of light emitting operation of the light emitting device 30 shown in FIGS. 8A and 8B and the semiconductor light emitting element 1 incorporated in the light emitting device 30.

In the light emitting device 30, when a current flows from the p-lead section 32 to the n-lead section 33 with respect to the semiconductor light emitting element 1, in the semiconductor light emitting element 1, a current from the p-side power supply portion 150 to the n-side power supply portion 160 is passed through the p-type semiconductor layer 140, the light emitting layer 130 and the n-type semiconductor layer 120 (from the n-cladding layer 122 to the n-contact layer 121). Then, in the p-side power supply portion 150, current is supplied to the seven p-side connective electrodes 154 directly from the p-side power supply electrode 152 or through the p-side auxiliary electrode 153 (the p-side first auxiliary electrode 153a and the p-side second auxiliary electrode 153b), and current flows to the p-type semiconductor layer 140 from the respective p-side connective electrodes 154 through the p-side transparent conductive layer 151. On the other hand, current is supplied to the three n-side connective electrodes 164 from n-contact layer 121 in the n-type semiconductor layer 120, and current flows to the n-side power supply electrode 162 from two of these n-side connective electrodes 164 through the n-side auxiliary electrode 163 and directly from the rest of the one n-side connective electrode 164 in the n-side power supply portion 160. With this current flow, the light emitting layer 130 emits light according to the configuration thereof (for example, blue light).

The light emitted from the light emitting layer 130 is further emitted to the outside of the semiconductor light emitting element 1, and a part thereof is converted into the other color (red color and green color) by the fluorescence body contained in the sealing section 34. Thereafter, the light containing blue light, green light and red light are emitted from a top surface of the sealing section 34 to the outside of the light emitting device 30 directly or after being reflected by an inner wall surface provided in the concave section 31a of the housing 31.

Next, behavior of the light emitted from the light emitting layer 130 in the semiconductor light emitting element 1 shown in FIG. 1 and the like will be described.

In the semiconductor light emitting element 1, light toward the side of the p-type semiconductor layer 140 and the light toward the side of the n-type semiconductor layer 120 are mainly emitted from the light emitting layer 130.

Among these, the light toward the side of the n-type semiconductor layer 120 from the light emitting layer 130 is reflected at the interface portion, for example, between the n-contact layer 121 (actually the base layer) and the substrate 110 because of differences in reflection rate thereof. The light having approached into the inside of the substrate 110 is reflected at the interface portion between the substrate 110 and p-lead section 32 or n-lead section 33. These reflected lights proceeds toward the side of the p-type semiconductor layer 140 through the light emitting layer 130.

The light toward the side of the p-type semiconductor layer 140 from the light emitting layer 130 reaches the power supply insulating layer 170 through the p-type semiconductor layer 140 and the p-side transparent conductive layer 151. Here, the light having reached the thin-film portion 171 among the power supply insulating layer 170 passes through the thin-film portion 171, and is emitted outside through the protective insulating layer 180. In contrast, the light having reached the thick-film portion 172 among the power supply insulating layer 170 is reflected at the thick-film portion 172, and proceeds toward the side of the light emitting layer 130 through the p-side transparent conductive layer 151 and the p-type semiconductor layer 140. The light having reached the light emitting layer 130 by being reflected at the thick-film portion 172 proceeds toward the side of the substrate 110 together with the light toward the n-type semiconductor layer 120 from the light emitting layer 130, thereafter, is reflected in the above-described process, and proceeds toward the p-type semiconductor layer 140 again through the light emitting layer 130, further, is emitted outside through the p-side transparent conductive layer 151, the thin-film portion 171 of the power supply insulating layer 170, and the protective insulating layer 180.

In the present exemplary embodiment, since the n-side power supply electrode 162 and the n-side auxiliary electrode 163, which electrically connect the plural n-side connective electrodes 164 in the n-side power supply portion 160, are provided at the rear side of the p-type semiconductor layer 140 in the view from the light emitting layer 130, it is not necessary to grind the light emitting layer 130 to connect the above electrodes. Therefore, it is possible to suppress decrease of the area of the light emitting layer 130 in the semiconductor light emitting element 1 having the same area as the light emitting layer 130, as a result, it is possible to suppress decrease of the amount of the light emission.

Further, in the present exemplary embodiment, the light toward the respective above-described portions from the light emitting layer 130 is reflected at the thick-film portion 172 by providing the thick-film portion 172 in the power supply insulating layer 170 at the lower side of the p-side power supply electrode 152 and the p-side auxiliary electrode 153 (the p-side first auxiliary electrode 153a and the p-side second auxiliary electrode 153b) in the p-side power supply portion 150 (however, except for the forming portion of the p-side connective electrode 154) and at the lower side of the n-side power supply electrode 162 and the n-side auxiliary electrode 163 in the n-side power supply portion 160 (however, except for the forming portion of the n-side connective electrode 164), in the upper side of the p-type semiconductor layer 140. Therefore, the light emitted from the light emitting layer 130 is not likely to be absorbed in the respective above-described portions, so it is possible to suppress decrease of the amount of the light emission still more. Especially, in the present exemplary embodiment, TaN colored ginger or black is used as the adhere layers (the p-side first power supply layer 1501 and the n-side first power supply layer 1601) of the p-side power supply portion 150 and the n-side power supply portion 160, thereby the light emitted from the light emitting layer 130 is easily absorbed. Therefore, applying such a configuration is effective.

In the present exemplary embodiment, in the upper side of the p-type semiconductor layer 140, the light toward the portions which are not positioned lower side of the p-side power supply electrode 152, the p-side auxiliary electrode 153, the n-side power supply electrode 162 and the n-side auxiliary electrode 163 transmits at the thin-film portion 171 by providing the thin-film portion 171 in the power supply insulating layer 170. Therefore, the light emitted from the light emitting layer 130 is easily emitted outside and it is possible to suppress decrease of the amount of the light emission still more.

Second Exemplary Embodiment

In the first exemplary embodiment, the n-side power supply electrode 162, the n-side auxiliary electrode 163 and the n-side connective electrode 164 which configure the n-side power supply portion 160 are composed of metal materials. In contrast, in the present exemplary embodiment, among the n-side power supply portion 160, the n-side power supply electrode 162 is composed of metal materials, on the other hand, the n-side auxiliary electrode 163 and the n-side connective electrode 164 are composed of transparent conductive materials. In the present exemplary embodiment, it should be noted that same symbols are assigned to configurations same as those in the first exemplary embodiment, and detailed description thereof will be omitted.

Figure 9:
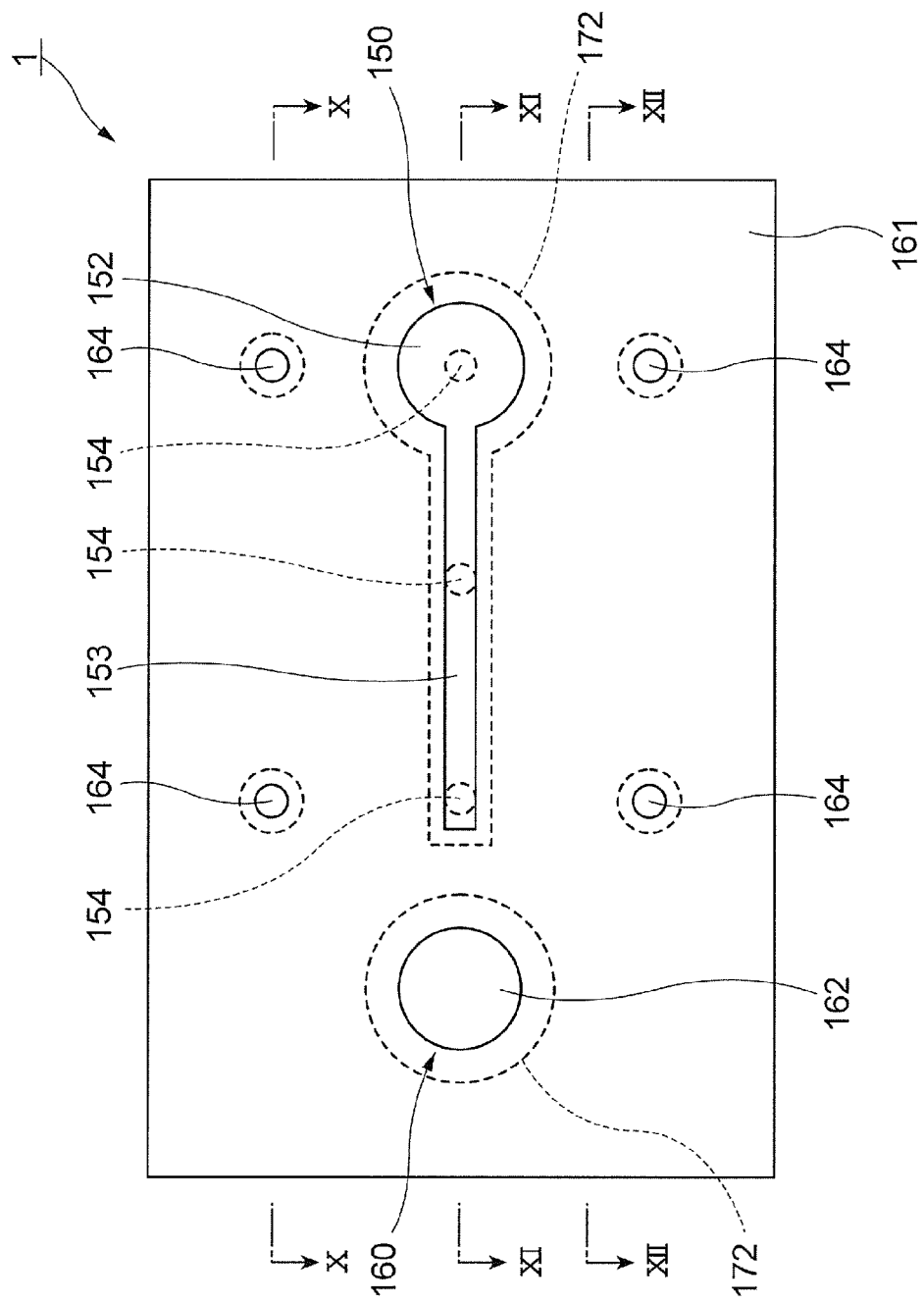
FIG. 9 is a diagram showing a specific example of an upper surface of a semiconductor light emitting element according to the second exemplary embodiment.
Figure 10:
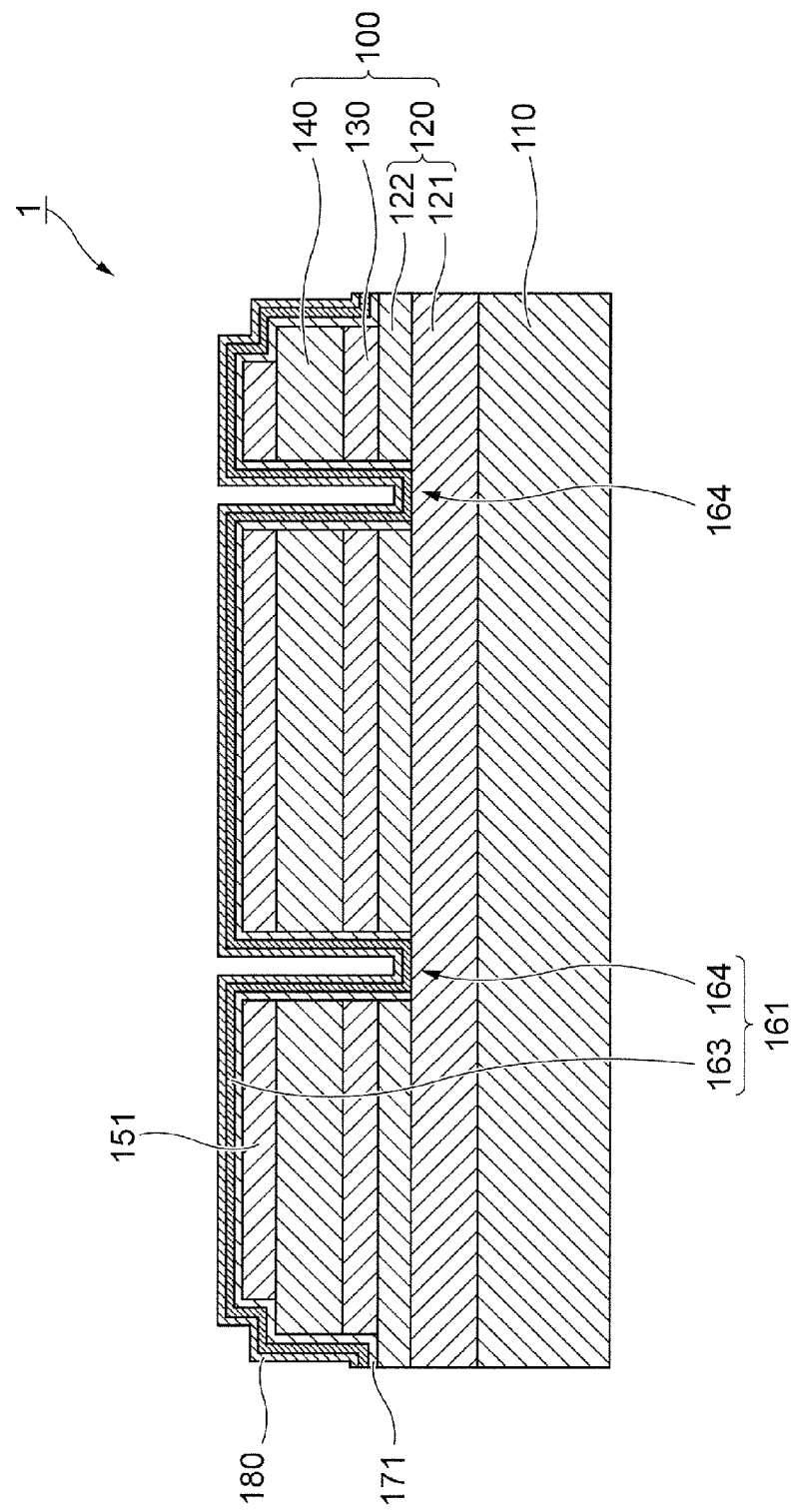
FIG. 10 is a X-X cross-sectional view in FIG. 9.
Figure 11:
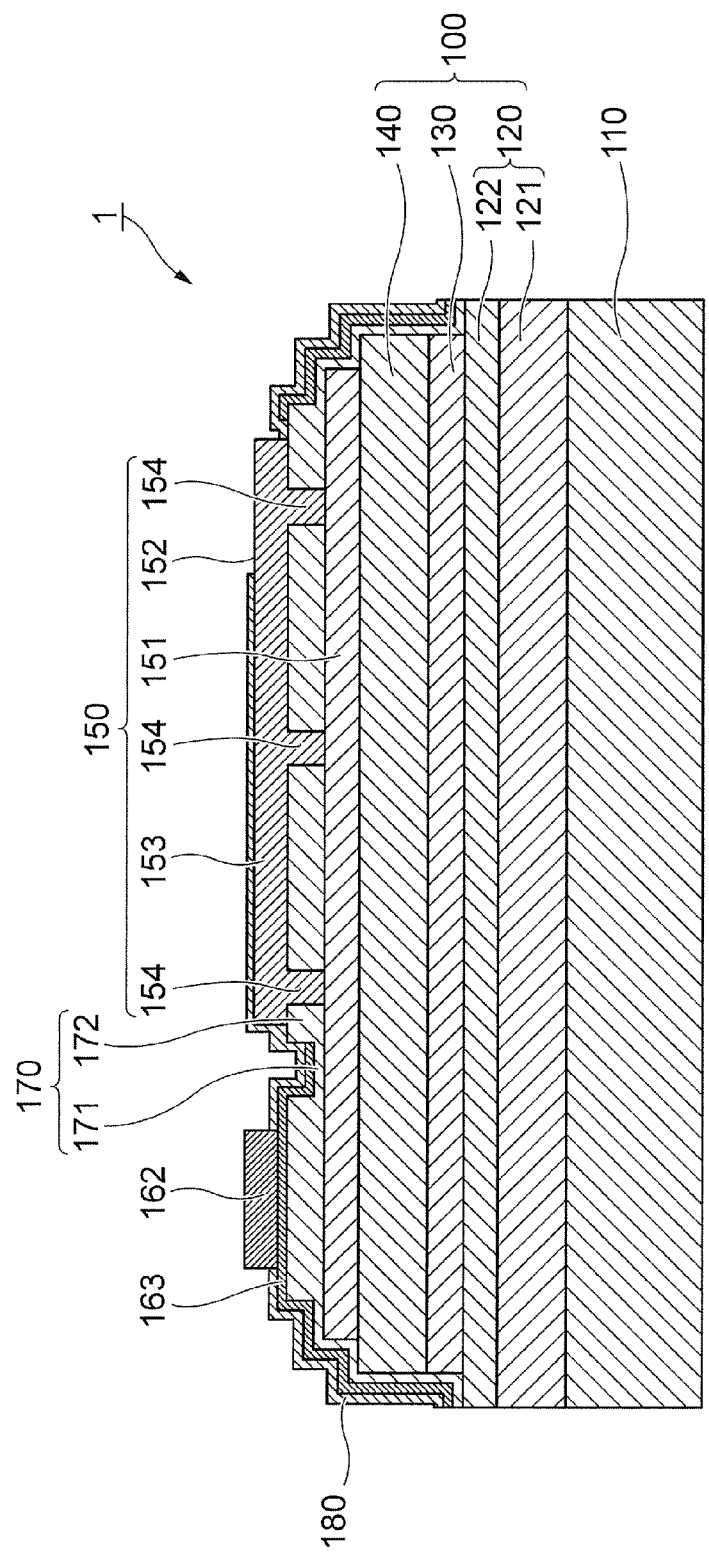
FIG. 11 is a XI-XI cross-sectional view in FIG. 9.
Figure 12:
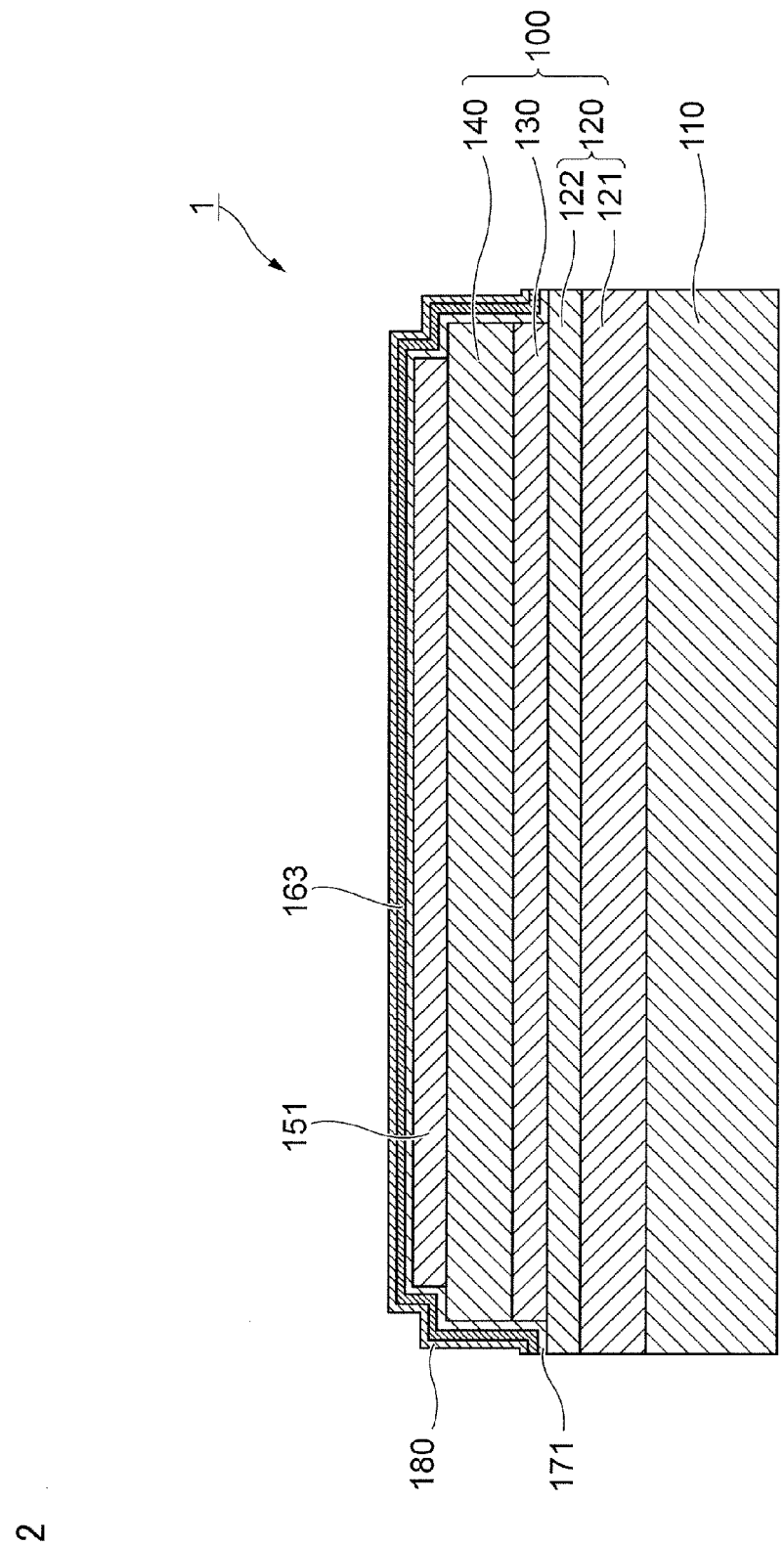
FIG. 12 is a XII-XII cross-sectional view in FIG. 9.

FIG. 9 is a diagram showing a specific example of an upper surface of a semiconductor light emitting element 1 according to the second exemplary embodiment. FIG. 10 is a X-X cross-sectional view in FIG. 9. FIG. 11 is a XI-XI cross-sectional view in FIG. 9. FIG. 12 is a XII-XII cross-sectional view in FIG. 9.

The semiconductor light emitting element 1 of the present exemplary embodiment includes: a substrate 110; an n-type semiconductor layer 120 (an n-contact layer 121 and an n-cladding layer 122) laminated on the substrate 110; a light emitting layer 130 laminated on the n-type semiconductor layer 120; and a p-type semiconductor layer 140 laminated on the light emitting layer 130. Moreover, the semiconductor light emitting element 1 includes; a p-side power supply portion 150 electrically connected to the p-type semiconductor layer 140, and an n-side power supply portion 160 electrically connected to the n-type semiconductor layer 120. Further, between the p-side power supply portion 150 and the n-side power supply portion 160, the semiconductor light emitting element 1 includes; a power supply insulating layer 170 to electrically insulate the p-side power supply portion 150 and the n-side power supply portion 160 each other, and a protective insulating layer 180 that protects the light emitting layer 130 and the like from water which goes into inside of the semiconductor light emitting element 1 from outside and that electrically insulates the p-side power supply portion 150 and the n-side power supply portion 160 each other. It should be noted that, in FIG. 9, the description of the protective insulating layer 180 is omitted, which is actually positioned at an uppermost layer (at the most front side)

Here, the p-side power supply portion 150 includes; a p-side transparent conductive layer 151 which is laminated on the p-type semiconductor layer 140 and on which the power supply insulating layer 170 is laminated; a p-side power supply electrode 152 and a p-side auxiliary electrode 153 which are laminated on the power supply insulating layer 170; and plural p-side connective electrodes 154 (in this exemplary embodiment, three) that electrically connect the p-side transparent conductive layer 151 with any one of the p-side power supply electrode 152 and the p-side auxiliary electrode 153 via holes penetrating through the power supply insulating layer 170.

In the p-side power supply portion 150 of the present exemplary embodiment, the p-side transparent conductive layer 151 is formed to cover the almost whole upper surface of the p-type semiconductor layer 140 except for peripheries thereof.

Moreover, in the p-side power supply portion 150 of the present exemplary embodiment, the p-side power supply electrode 152 is, on the top surface of the semiconductor light emitting element 1, arranged at one edge side in the longitudinal direction (the right side in FIG. 9) and at a center portion in the short direction, and has a circular shape in the view from top surface side. The protective insulating layer 180 is not laminated on the top surface of the p-side power supply electrode 152 (for example, refer to FIG. 11), and the p-side power supply electrode 152 is exposed outside.

Furthermore, in the p-side power supply portion 150 of the present exemplary embodiment, one p-side auxiliary electrode 153 is integrated with the p-side power supply electrode 152 at the side of one edge and extends along the longitudinal direction of the semiconductor light emitting element 1 at the side of the other edge toward the p-side power supply electrode 162. The protective insulating layer 180 is laminated on the top surface of the p-side auxiliary electrode 153 (for example, refer to FIG. 11). Also in the present exemplary embodiment, one n-side connective electrodes 154 is provided at the lower side of the p-side auxiliary electrode 152, and two p-side connective electrodes 154 are provided at the lower side of the p-side auxiliary electrode 153 respectively.

On the other hand, the n-side power supply portion 160 includes; an n-side transparent conductive layer 161 formed extending over the top of the power supply insulating layer 170 and the inside of plural holes (in this specific example, four holes) penetrating the power supply insulating layer 170, the p-side transparent conductive layer 151 in the power supply portion 150, the p-type semiconductor layer 140, the light emitting layer 130, and the n-clad layer 122 in the n-type semiconductor layer 120; and the n-side power supply electrode 162 formed on the n-side transparent conductive layer 161 positioned on the power supply insulating layer 170.

In the n-side power supply portion 160 of the present exemplary embodiment, the n-side transparent conductive layer 161 is formed covering almost the whole of the top surface of the power supply insulating layer 170 except for the p-side power supply electrode 152 and the p-side auxiliary electrode 153 in the p-side power supply portion 150 (specifically the forming portion of the thick-film portion 172 provided to correspond to the p-side power supply electrode 152 and the p-side auxiliary electrode 153 among the thick-film portion 170).

Further, in the n-side power supply portion 160 of the present exemplary embodiment, the n-side power supply electrode 162 is, on the top surface of the semiconductor light emitting element 1, arranged at the other edge side in the longitudinal direction (the left side in FIG. 9) and at a center portion in the short direction, and has a circular shape in the view from top surface side. The protective insulating layer 180 is not laminated on the top surface of the n-side power supply electrode 162 (for example, refer to FIG. 11), and the n-side power supply electrode 162 is exposed outside.

Here, in the present exemplary embodiment, the portion formed on the power supply insulating layer 170 functions as the n-side auxiliary electrode 163, and the portions formed inside of the holes provided at the four places (in this specific example, four holes) respectively function as the n-side connective electrode 164 among the n-side transparent conductive layer 161. Thus the above-described n-side power supply electrode 162 is provided on the n-side transparent connective layer 161 functions as the n-side auxiliary electrode 163 in the state of being electrically connected to the n-side transparent conductive layer 161.

Moreover, the above-described power supply insulating layer 170 is provided on the respective side walls of the plural holes provided to correspond to the n-side transparent conductive layer 161 configuring the respective n-side connective electrodes 164. Therefore, the respective n-side connective electrodes 164 are not directly contact with at least the p-side transparent conductive layer 151, the p-type semiconductor layer 140, and the light emitting layer 130. On the other hand, the power supply insulating layer 170 is not provided on the lower side portion of the plural holes, and the respective n-side connective electrodes 164 and the n-side contact layer 121 are directly contacted.

In this specific example, It should be noted that the n-side connective electrode 164 is not provided at the lower side of the n-side power supply electrode 162, but the n-side connective electrode 164 may be provided at the lower side of the n-side power supply electrode 162 as well as the first exemplary embodiment.

Further, in the n-side power supply portion 160 of the present exemplary embodiment, the thick-film portion 172 in the power supply insulating layer 170 is provided on the portions at lower side of the p-side power supply electrode 152 and the p-side auxiliary electrode 153 which configure the p-side power supply portion 150, and provided on the portions at the lower side of the n-side power supply electrode 162 which configures the n-side power supply portion 160, and the thin-film portion 171 is provided on the portions except for the thick-film portion 172. Therefore in the present exemplary embodiment, the configuration in which the thin-film portion 171 in the power supply insulating layer 170 is provided at the lower side of the 163 configuring the n-side power supply portion 160 (except for lower side of portions where the n-side power supply electrode 162 is formed) is different from that of the first exemplary embodiment.

Moreover, the protective insulating layer 180 covers the top surfaces of the semiconductor light emitting element 1 except for the p-side power supply electrode 152 in the p-side power supply portion 150 and except for the n-side power supply electrode 162 in the n-side power supply portion 160. In this specific example, the protective insulating layer 180 is laminated inside of the four holes provided to correspond to the n-side connective electrode 164.

In the semiconductor light emitting element 1 of the present exemplary embodiment, for example like shown in FIG. 10 to FIG. 12, the power supply insulating layer 170, the n-side transparent conductive layer 161, and the protective insulating layer 180 cover the side surfaces of the light emitting layer 130 and the p-type semiconductor layer 140. However, since the power supply insulating layer 170 is provided, the n-side transparent conductive layer 161 is not directly contact with the side surface of the n-type semiconductor layer 120, the light emitting layer 130 and the p-type semiconductor layer 140.

The details of the n-side transparent conductive layer 161 which is a characteristic configuration element in the present exemplary embodiment will be explained below.

[N-Side Transparent Conductive Layer]

As the n-side transparent conductive layer 161, it is preferable to employ those that can make an ohmic contact with the n-contact layer 121 in the n-type semiconductor layer 120 and has small contact resistance with the n-contact layer 121. Further, in the semiconductor light emitting element 1, since the light from the light emitting layer 130 is emitted to the protective insulating layer 180 side via the n-side transparent conductive layer 161, it is preferable to employ those having excellent optical permeability as the n-side transparent conductive layer 161. Still further, for uniformly passing a current over the entire surface of the n-type semiconductor layer 120, it is preferable to use the n-side transparent conductive layer 161 having excellent conductivity and narrow resistance distribution.

It should be noted that the thickness of the n-side transparent conductive layer 161 can be selected from the range of 2 nm to 500 nm. Here, if the thickness of the n-side transparent conductive layer 161 is less than 2 nm, there are some cases where an ohmic contact with the n-contact layer 121 is hardly available, and if the thickness of the n-side transparent conductive layer 161 is more than 500 nm, there are some cases that are not preferable in terms of optical permeability to the light emitted from the light emitting layer 130.

The material explained in the terms of the p-side transparent conductive layer 151 in the first exemplary embodiment can be used as a material constituting the n-side transparent conductive layer 161. In the present exemplary embodiment, it should be noted that the n-side transparent conductive layer 161 is composed of the same material as the p-side transparent conductive layer 151.

The n-side power supply electrode 162 in the present exemplary embodiment is configured with the n-side first power supply layer 1601 composed of TaN, the n-side second power supply layer 1602 composed of Pt, and the n-side third power supply layer 1603 composed of Au laminated as well as the first exemplary embodiment. Therefore in the present exemplary embodiment, the p-side power supply electrode 152, the p-side auxiliary electrode 153 and the p-side connective electrode 154 in the p-side power supply portion 150, and the n-side power supply electrode 162 in the n-side power supply portion 160 have the configuration in common.

The semiconductor light emitting element 1 of the present exemplary embodiment can be used by being incorporated into the light emitting device 30 shown in FIGS. 8A and 8B, similarly to the semiconductor light emitting element 1 explained in the first exemplary embodiment. Hereinafter, description will be given of light emitting operation of the light emitting device 30 shown in FIGS. 8A and 8B and the semiconductor light emitting element 1 incorporated in the light emitting device 30.

In the light emitting device 30, when a current flows from the p-lead section 32 to the n-lead section 33 with respect to the semiconductor light emitting element 1, in the semiconductor light emitting element 1, a current from the p-side power supply portion 150 to the n-side power supply portion 160 is passed through the p-type semiconductor layer 140, the light emitting layer 130 and the n-type semiconductor layer 120 (from the n-cladding layer 122 to the n-contact layer 121). Then, in the p-side power supply portion 150, current is supplied to the three p-side connective electrodes 154 directly from the p-side power supply electrode 152 or through the p-side auxiliary electrode 153, and current flows to the p-type semiconductor layer 140 through the p-side transparent conductive layer 151 from the respective p-side connective electrodes 154. On the other hand, current is supplied to the four n-side connective electrode 164 from the n-contact layer 121 in the n-type semiconductor layer 120, and current flows to the n-side power supply electrode 162 through the n-side auxiliary electrode 163 from the four n-side connective electrodes 164 in the n-side power supply portion 160. In another point of view, the n-side power supply electrode 162 is supplied a current through the n-side transparent conductive 161 from the four portions in the n-contact layer 121 (the forming places of the respective holes) in the n-side power supply portion 160. Accordingly, light emitting layer 130 outputs light (for example, blue light) corresponding to the composition thereof.

The light emitted from the light emitting layer 130 is further emitted to the outside of the semiconductor light emitting element 1, and a part of that is converted into the other colors (red color and green color) by the fluorescence body contained in the sealing section 34. Thereafter, the light containing green light and red light is emitted from a top surface of the sealing section 34 to the outside of the light emitting device 30 directly or after being reflected by an inner wall surface provided in the concave section 31a of the housing 31.

Next, behavior of the light emitted from the light emitting layer 130 in the semiconductor light emitting element 1 shown in FIG. 9 and the like will be described.

In the semiconductor light emitting element 1, the light toward the side of the p-type semiconductor layer 140 and the light toward the side of the n-type semiconductor layer 120 are mainly emitted from the light emitting layer 130.

Among these, the light toward the side of the n-type semiconductor layer 120 from the light emitting layer 130 is reflected, for example, at the interface portion between the n-contact layer 121 (actually the base layer) and the substrate 110 by differences in reflection rate thereof. The light having approached into the inside the substrate 110 is reflected at the interface portion between the substrate 110 and the p-lead portion 32 or the n-lead portion 33. These reflected light proceeds toward the side of the p-type semiconductor layer 140 through the light emitting layer 130.

The light toward the side of the p-type semiconductor layer 140 from the light emitting layer 130 reaches the power supply insulating layer 170 through the p-type semiconductor layer 140 and the p-side transparent conductive layer 151. Here, the light having reached the thin-film portion 171 among the power supply insulating layer 170 passes through the thin-film portion 171 and is emitted outside by passing through the n-side transparent conductive layer 161 (the n-side auxiliary electrode 163) and the protective insulating layer 180. In contrast, the light having reached the thick-film portion 172 among the power supply insulating layer 170 is reflected at the thick-film portion 172 and proceeds toward the side of the light emitting layer 130 through the p-side transparent conductive layer 151 and the p-type semiconductor layer 140. The light having reached the light emitting layer 130 by being reflected at the thick-film portion 172 proceeds toward the side of the substrate 110 together with the light toward the n-type semiconductor layer 120 from the light emitting layer 130, thereafter, proceeds toward the side of the p-type semiconductor layer 140 through the light emitting layer 130 again by being reflected in the above-described process, and is emitted outside through the p-side transparent conductive layer 151, the thin-film portion 171 of the power supply insulating layer 170, the n-side transparent conductive layer 161, and the protective insulating layer 180.

In the present exemplary embodiment, because the n-side power supply electrode 162 and the n-side auxiliary electrode 163, which electrically connect the plural n-side connective electrodes 164 in the n-side power supply portion 160, are provided at the rear side of the p-type semiconductor layer 140 in the view from the light emitting layer 130, it is not necessary to grind the light emitting layer 130 to connect the above electrodes. Therefore, it is possible to suppress decrease of the area of the light emitting layer 130 in the semiconductor light emitting element 1 having the same area as the light emitting layer 130, as a result, it is possible to suppress decrease of the amount of the light emission.

Further, in the present exemplary embodiment, it is possible to make the light toward the n-side auxiliary electrode 163 from the light emitting layer 130 be transmitted directly, compared with the first exemplary embodiment, by configuring the n-side auxiliary electrode 163 and the plural n-side connective electrodes 164 in the n-side power supply portion 160 with a transparent conductive material and providing the thin-film portion 171 in the power supply insulating layer 170 at the rear side of the n-side auxiliary electrode 163. Therefore, it is possible to suppress decrease of the amount of the light repeatedly reflected inside the semiconductor layer 1 so that, it is possible to improve the light emission.

In the present exemplary embodiment, the thick-film portion 172 in the power supply insulating layer 170 is provided at the rear side of the n-side power supply electrode 162 composed of a metal material among the n-side power supply portion 160 as well as the first exemplary embodiment, thereby the light toward the n-side power supply electrode 162 from the light emitting layer 130 is reflected at the thick-film portion 172 and is not easily absorbed by the n-side power supply electrode 162, which results in that it is possible to suppress decrease of the amount of the light emission.

Third Exemplary Embodiment

In the third exemplary embodiment, the configuration is almost the same as the second exemplary embodiment, but the position and the configuration of the p-side power supply portion 150 and the n-side power supply portion 160 in the semiconductor layer 1 is different from that of second exemplary embodiment. In the present exemplary embodiment, it should be noted that same symbols are assigned to configurations same as those in the exemplary embodiment 2, and detailed description thereof will be omitted.

Figure 13:
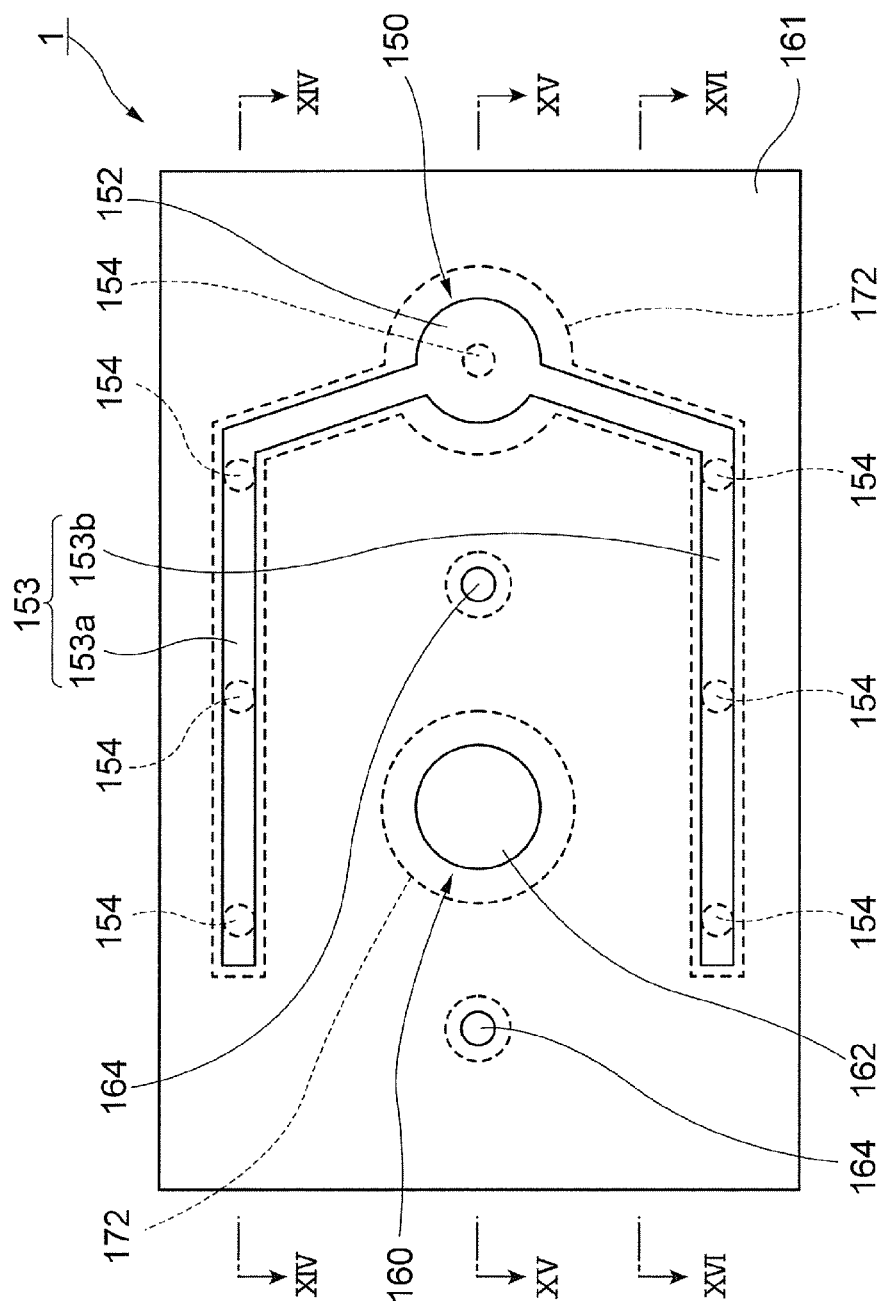
FIG. 13 is a specific example of an upper surface of a semiconductor light emitting element according to the third exemplary embodiment.
Figure 14:
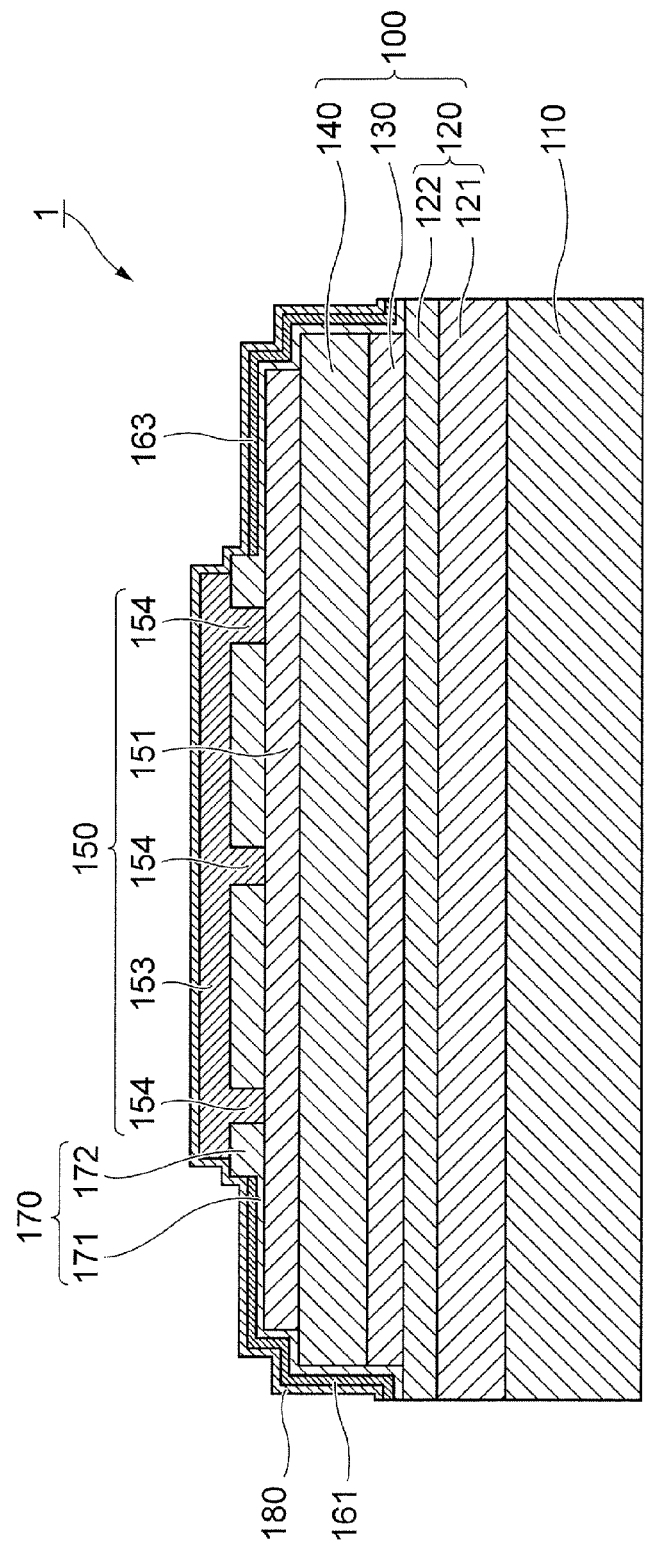
FIG. 14 is a XIV-XIV cross-sectional view in FIG. 13.
Figure 15:
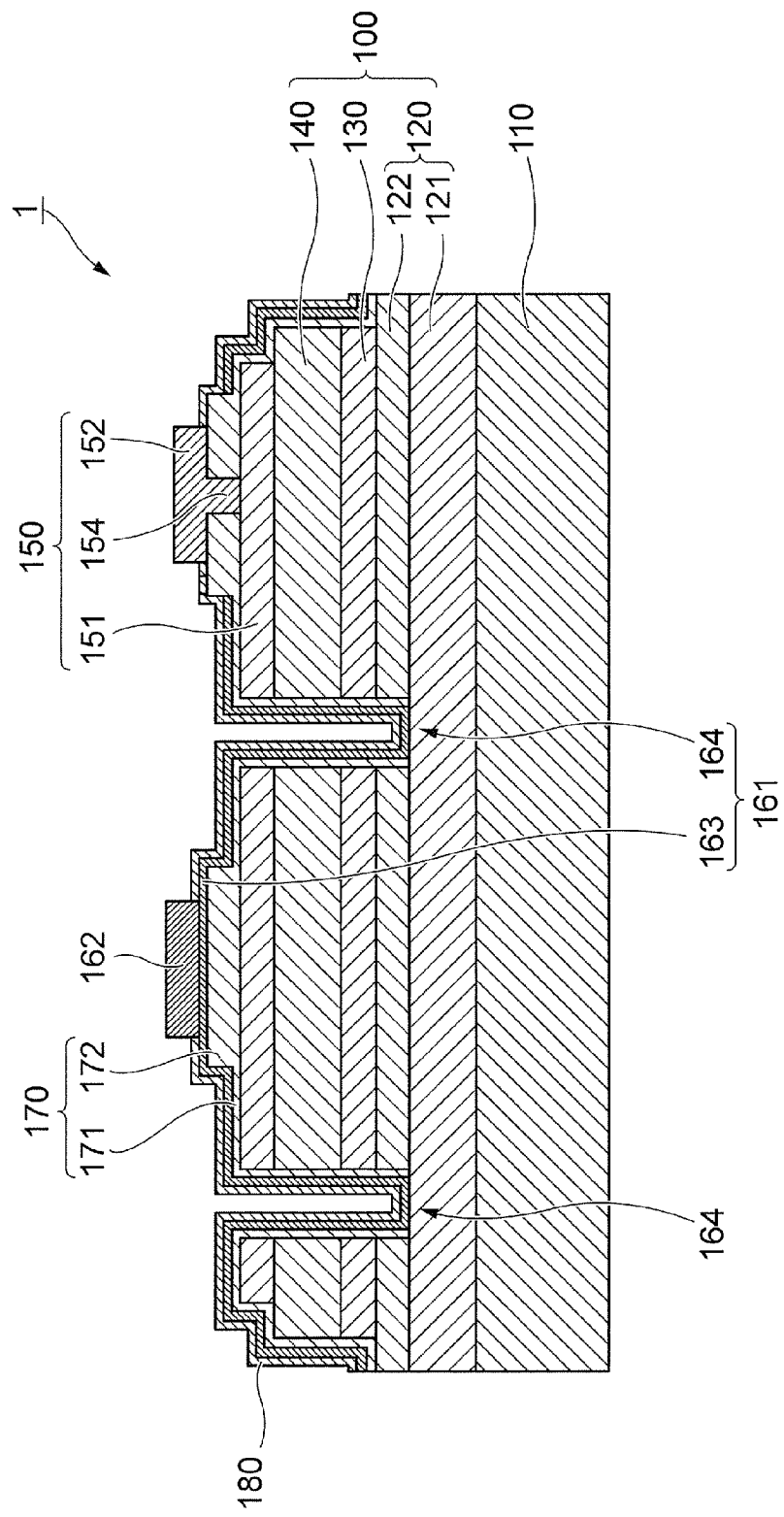
FIG. 15 is a XV-XV cross-sectional view in FIG. 13.
Figure 16:
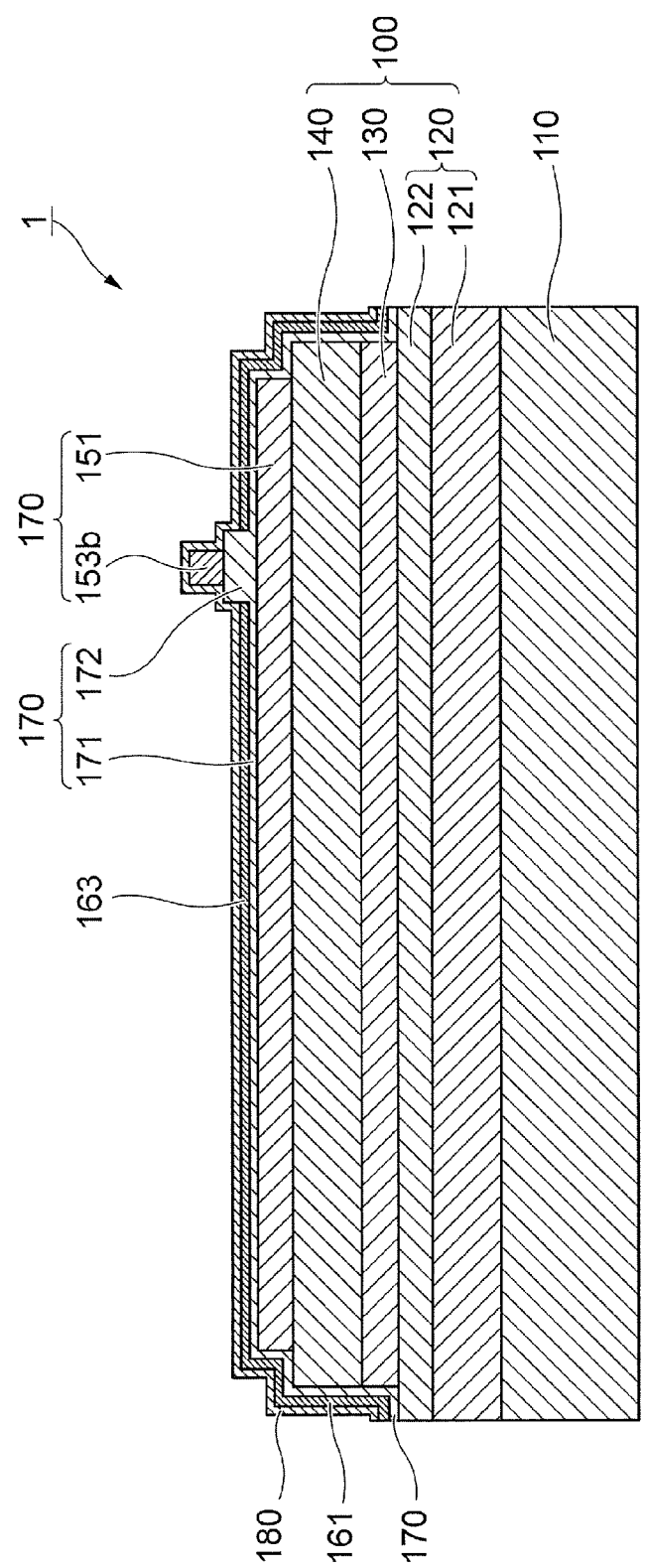
FIG. 16 is a XVI-XVI cross-sectional view in FIG. 13.

FIG. 13 is a specific example of an upper surface of a semiconductor light emitting element 1 according to the third exemplary embodiment. FIG. 14 is a XIV-XIV cross-sectional view in FIG. 13. FIG. 15 is a XV-XV cross-sectional view in FIG. 13. FIG. 16 is a XVI-XVI cross-sectional view in FIG. 13.

The semiconductor light emitting element 1 of the present exemplary embodiment includes: a substrate 110; an n-type semiconductor layer 120 (an n-contact layer 121 and an n-cladding layer 122) laminated on the substrate 110; a light emitting layer 130 laminated on the n-type semiconductor layer 120; and a p-type semiconductor layer 140 laminated on the light emitting layer 130. Moreover, the semiconductor light emitting element 1 includes; a p-side power supply portion 150 electrically connected to the p-type semiconductor layer 140, and an n-side power supply portion 160 electrically connected to the n-type semiconductor layer 120. Further, between the p-side power supply portion 150 and the n-side power supply portion 160, the semiconductor light emitting element 1 includes; a power supply insulating layer 170 to electrically insulate the p-side power supply portion 150 and the n-side power supply portion 160 each other, and a protective insulating layer 180 that protects the light emitting layer 130 and the like from water which goes into inside of the semiconductor light emitting element 1 from outside and that electrically insulates the p-side power supply portion 150 and the n-side power supply portion 160 each other. It should be noted that, in FIG. 9, the description of the protective insulating layer 180 is omitted, which is actually positioned at an uppermost layer (at the most front side)

Here, the p-side power supply portion 150 includes; a p-side transparent conductive layer 151 which is laminated on the p-type semiconductor layer 140 and on which the power supply insulating layer 170 is laminated; a p-side power supply electrode 152 and a p-side auxiliary electrode 153 which are laminated on the power supply insulating layer 170; and plural p-side connective electrodes 154 (in this exemplary embodiment, seven) that electrically connect the p-side transparent conductive layer 151 with any one of the p-side power supply electrode 152 and the p-side auxiliary electrode 153 via holes penetrating through the power supply insulating layer 170.

In the p-side power supply portion 150 of the present exemplary embodiment, the p-side transparent conductive layer 151 is formed to cover the almost whole upper surface of the p-type semiconductor layer 140 except for peripheries thereof.

Moreover, in the p-side power supply portion 150 of the present exemplary embodiment, the p-side power supply electrode 152 is, on the top surface of the semiconductor light emitting element 1, arranged at one edge side in the longitudinal direction (the right side in FIG. 13) and at a center portion in the short direction, and has a circular shape in the view from top surface side. The protective insulating layer 180 is not laminated on the top surface of the p-side power supply electrode 152 (for example, refer to FIG. 15), and the p-side power supply electrode 152 is exposed outside.

Furthermore, in the p-side power supply portion 150 of the present exemplary embodiment, the p-side auxiliary electrode 153 includes: an L-shaped p-side first auxiliary electrode 153a which is integrated with the p-side power supply electrode 152 at the side of one edge and extends along the semiconductor light emitting element 1 at the side of the other edge in the longitudinal direction; and an L-shaped p-side second auxiliary electrode 153b which is integrated with the p-side power supply electrode 152 at the side of one edge and extends along the longitudinal direction of the semiconductor light emitting element 1 at the side of the other edge. Here, in the present exemplary embodiment, the p-side first auxiliary electrode 153a and the p-side second auxiliary electrode 153b do not come into directly contact with each other by providing the p-side first auxiliary electrode 153a at the side of one edge in the short direction of the semiconductor light emitting element 1 (at the side of the upper part in FIG. 13) and the p-side second auxiliary electrode 153b at the side of the other edge in the short direction of the semiconductor light emitting element 1 (at the side of the lower part FIG. 13). The protective insulating layer 180 is laminated on the top surfaces of these the p-side first auxiliary electrode 153a and the p-side second auxiliary electrodes 153b (for example, refer to FIG. 14 and FIG. 16). Also, in the present exemplary embodiment, the p-side connective electrode 154 is provided at the lower side of the p-side power supply electrode 152, the three p-side connective electrodes 154 are provided at the lower side of the p-side first auxiliary electrode 153a, and the three p-side connective electrodes 154 are provided at the lower side of the p-side second auxiliary electrode 153b respectively.

On the other hand, the n-side power supply portion 160 includes: an n-side transparent conductive layer 161 formed extending over the top of the power supply insulating layer 170 and the inside of plural holes (in this specific example, two holes) penetrating the power supply insulating layer 170, the p-side transparent conductive layer 151 in the power supply portion 150, the p-type semiconductor layer 140, the light emitting layer 130, and the n-clad layer 122 in the n-type semiconductor layer 120; and the n-side power supply electrode 162 formed on the n-side transparent conductive layer 161 positioned on the power supply insulating layer 170.

In the n-side power supply portion 160 of the present exemplary embodiment, the n-side transparent conductive layer 161 is formed to cover almost the whole of the top surfaces of the power supply insulating layer 170 except for the forming portions of the p-side power supply portion 150 (specifically the forming portions of the thick-film portion 172 provided to correspond to the p-side power supply electrode 152 and the p-side auxiliary electrode 153 among the power supply insulating layer 170).

Further, in the n-side power supply portion 160 of the present exemplary embodiment, the n-side power supply electrode 162, on the top surface of the semiconductor light emitting element 1, arranged at the other edge side in the longitudinal direction (the left side in FIG. 13) and at a center portion in the short direction (an area interposed between the p-side first auxiliary electrode 153a and p-side second auxiliary electrode 153b which configure the p-side power supply portion 150), and has a circular shape in the view from top surface side. The protective insulating layer 180 is not laminated on the top surface of the n-side power supply electrode 162 (for example, refer to FIG. 15), and the n-side power supply electrode 162 is exposed outside.

Here, in the present exemplary embodiment, the portion formed on the power supply insulating layer 170 functions as the n-side auxiliary electrode 163, and the portions formed inside of the holes provided at the two places (in this specific example, two holes) respectively function as the n-side connective electrode 164 among the n-side transparent conductive layer 161. Thus the above-described n-side power supply electrode 162 is provided on the n-side transparent connective layer 161 functions as the n-side auxiliary electrode 163 in the state of being electrically connected to the n-side transparent conductive layer 161.

Moreover, the above-described power supply insulating layer 170 is provided on the respective side walls of the plural holes provided to correspond to the n-side transparent conductive layer 161 configuring the respective n-side connective electrodes 164. Therefore, the respective n-side connective electrodes 164 are not directly contact with at least the p-side transparent conductive layer 151, the p-type semiconductor layer 140, and the light emitting layer 130. On the other hand, the power supply insulating layer 170 is not provided on the lower side portion of the plural holes, and the respective n-side connective electrodes 164 and the n-side contact layer 121 are directly contacted.

In this specific example, it should be noted that the n-side connective electrode 164 is not provided at the lower side of the n-side power supply electrode 162, but the n-side connective electrode 164 may be provided at the lower side of the n-side power supply electrode 162 as well as the first exemplary embodiment.

Further, in the present exemplary embodiment, the thick-film portion 172 in the power supply insulating layer 170 is provided on the portions at lower side of the p-side power supply electrode 152 and the p-side auxiliary electrode 153 which configure the p-side power supply portion 150 and on the portions at the lower side of the n-side power supply electrode 162 configures the n-side power supply portion 160, and the thin-film portion 171 is provided on the portions except for the thick-film portion 172.

Moreover, the protective insulating layer 180 covers the top surfaces of the semiconductor light emitting element 1 except for the p-side power supply electrode 152 in the p-side power supply portion 150 and the n-side power supply electrode 162 in the n-side power supply portion 160. In this specific example, the protective insulating layer 180 is laminated inside of the two holes provided to correspond to the n-side connective electrode 164 as well.

In the semiconductor light emitting element 1 of the present exemplary embodiment, for example like shown in FIG. 14 to FIG. 16, the power supply insulating layer 170, the n-side transparent conductive layer 161 and the protective insulating layer 180 cover the side surfaces of the light emitting layer 130 and the p-type semiconductor layer 140. However, since the power supply insulating layer 170 is provided, the n-side transparent conductive layer 161 is not directly contact with the side surface of the n-type semiconductor layer 120, the light emitting layer 130 and the p-type semiconductor layer 140.

The semiconductor light emitting element 1 in the present exemplary embodiment can be used by installing in the light emitting device 30 shown in FIG. 8 as well as in the first exemplary embodiment. However, explanation of the detail of the light emitting working in the case of installing the semiconductor light emitting element 1 in the present exemplary embodiment in the light emitting device 30 shown in FIG. 8 is omitted here because the detail is basically the same as in the second exemplary embodiment.

In the first to the third exemplary embodiment, an example of the semiconductor light emitting element 1 composed of the a group III nitride semiconductor as a compound semiconductor is explained, but the semiconductor light emitting element 1 may be composed of a group III-V semiconductor and a group II-VI semiconductor.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The exemplary embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor light emitting element comprising:
a first semiconductor layer that is composed of a compound semiconductor with a first conductive type;
a light emitting layer that is provided on the first semiconductor layer to be in contact with the first semiconductor layer, is composed of a compound semiconductor, and emits light with current flow;
a second semiconductor layer that is provided on the light emitting layer to be in contact with the light emitting layer and composed of a compound semiconductor with a second conductive type different from the first conductive type;
a first power supply electrode that is provided at a rear side of the second semiconductor layer in the view from the light emitting layer, is composed of metal, and electrically connected to the first semiconductor layer;
a second power supply electrode that is provided at the rear side of the second semiconductor layer in the view from the light emitting layer, is composed of metal, and electrically connected to the second semiconductor layer; and
a transparent insulating layer that is provided at the rear side of the second semiconductor layer in the view from the light emitting layer, is composed of materials having permeability to the light of a wavelength emitted from the light emitting layer, and electrically insulates the first power supply electrode and the second power supply electrode; wherein,
the transparent insulating layer comprises;
a first transparent insulating portion that is set to have a first thickness with which the light emitted from the light emitting layer is transmitted, and is provided on portions provided at the rear side of the second semiconductor layer in the view from the light emitting layer and provided not to correspond to the first power supply electrode and the second power supply electrode; and
a second transparent insulating portion that is set to have a second thickness with which the light emitted from the light emitting layer is reflected, and is provided on portions between the second semiconductor layer and the first power supply electrode and on portions between the second semiconductor layer and the second power supply electrode.

2. The semiconductor light emitting element according to claim 1, further comprising a first connective electrode that is electrically connected to the first semiconductor layer through a hole penetrating the transparent insulating layer, the second semiconductor layer and the light emitting layer; and a first auxiliary electrode that is provided at the rear side of the second semiconductor layer in the view from the light emitting layer and electrically connects the first connective electrode and the first power supply electrode.

3. The semiconductor light emitting element according to claim 2, wherein, the first auxiliary electrode is composed of metal, and the second transparent insulating portion is provided between the second semiconductor layer and the first auxiliary electrode.

4. The semiconductor light emitting element according to claim 2, wherein,
the first connective electrode and the first auxiliary electrode are composed of transparent conductive materials having electronic conductivity and permeability to the light emitted from the light emitting layer.

5. The semiconductor light emitting element according to claim 1, wherein,
the compound semiconductor is composed of a group III nitride semiconductor, and
the first semiconductor layer is laminated on a substrate directly or through another layer.

6. The semiconductor light emitting element according to claim 2, wherein,
the compound semiconductor is composed of a group III nitride semiconductor, and
the first semiconductor layer is laminated on a substrate directly or through another layer.

7. The semiconductor light emitting element according to claim 3, wherein,
the compound semiconductor is composed of a group III nitride semiconductor, and
the first semiconductor layer is laminated on a substrate directly or through another layer.

8. The semiconductor light emitting element according to claim 4, wherein,
the compound semiconductor is composed of a group III nitride semiconductor, and
the first semiconductor layer is laminated on a substrate directly or through another layer.

9. A light emitting device comprising:
a base portion in which a first wiring and a second wiring are formed; and
a semiconductor light emitting element that is connected to the base portion by face up mounting, wherein
the semiconductor light emitting element comprises:
a first semiconductor layer that is composed of a compound semiconductor with a first conductive type;
a light emitting layer that is provided on the first semiconductor layer to be in contact with the first semiconductor layer, is composed of a compound semiconductor, and emits light with current flow;
a second semiconductor layer that is provided on the light emitting layer to be in contact with the light emitting layer and composed of a compound semiconductor with a second conductive type different from the first conductive type;

a first power supply electrode that is provided at a rear side of the second semiconductor layer in the view from the light emitting layer, is composed of metal, electrically connected to the first semiconductor layer, and electrically connected to the first wiring provided on the base portion;

a second power supply electrode that is provided at the rear side of the second semiconductor layer in the view from the light emitting layer, is composed of metal, electrically connected to the second semiconductor layer, and electrically connected to the second wiring provided on the base portion; and a transparent insulating layer that is provided at the rear side of the second semiconductor layer in the view from the light emitting layer, is composed of materials having permeability to the light of a wavelength emitted from the light emitting layer, and electrically insulates the first power supply electrode and the second power supply electrode; wherein, the transparent insulating layer comprises:

a first transparent insulating portion that is set to have a first thickness with which the light emitted from the light emitting layer is transmitted, and is provided on portions provided at the rear side of the second semiconductor layer in the view from the light emitting layer and provided not to correspond to the first power supply electrode and the second power supply electrode; and a second transparent insulating portion that is set to have a second thickness with which the light emitted from the light emitting layer is reflected, and is provided on portions between the second semiconductor layer and the first power supply electrode and on portions between the second semiconductor layer and the second power supply electrode.

* * * * *